(12) United States Patent
Kyogoku et al.

(10) Patent No.: US 10,199,466 B1
(45) Date of Patent: Feb. 5, 2019

(54) SEMICONDUCTOR DEVICE, METHOD FOR MANUFACTURING SEMICONDUCTOR DEVICE, INVERTER CIRCUIT, DRIVING DEVICE, VEHICLE, AND ELEVATOR

(71) Applicant: Kabushiki Kaisha Toshiba, Minato-ku (JP)

(72) Inventors: Shinya Kyogoku, Tsukuba (JP); Ryosuke Iijima, Setagaya (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/905,886

(22) Filed: Feb. 27, 2018

(30) Foreign Application Priority Data

Nov. 22, 2017 (JP) ................................ 2017-224117

(51) Int. Cl.
*H01L 29/16* (2006.01)
*H01L 29/78* (2006.01)
*H01L 29/10* (2006.01)
*H01L 29/66* (2006.01)
*H01L 29/423* (2006.01)

(52) U.S. Cl.
CPC ...... *H01L 29/1608* (2013.01); *H01L 29/1095* (2013.01); *H01L 29/4236* (2013.01); *H01L 29/42368* (2013.01); *H01L 29/66068* (2013.01); *H01L 29/7813* (2013.01)

(58) Field of Classification Search
CPC ........... H01L 29/1608; H01L 29/42368; H01L 29/66068; H01L 29/7813; H01L 29/1095
See application file for complete search history.

(56) References Cited

U.S. PATENT DOCUMENTS

| 2014/0145206 | A1 | 5/2014 | Siemieniec et al. |
| 2015/0340487 | A1* | 11/2015 | Siemieniec ........... H01L 21/046 257/77 |
| 2015/0357415 | A1* | 12/2015 | Kagawa ............ H01L 29/66068 257/77 |
| 2016/0163852 | A1 | 6/2016 | Siemieniec et al. |
| 2016/0172468 | A1 | 6/2016 | Esteve et al. |

FOREIGN PATENT DOCUMENTS

| JP | 2014-107571 | 6/2014 |
| JP | 2015-226060 | 12/2015 |
| JP | 5907940 | 4/2016 |
| JP | 2016-115936 | 6/2016 |
| JP | 2016-122835 | 7/2016 |

* cited by examiner

*Primary Examiner* — Dung Le
(74) *Attorney, Agent, or Firm* — Oblon, McClelland, Maier & Neustadt, L.L.P.

(57) ABSTRACT

A semiconductor device of an embodiment includes a silicon carbide layer including a first plane and a second plane; a trench including a first side face, a second side face, and a bottom face; a first silicon carbide region of a first-conductivity type; a second silicon carbide region of a second-conductivity type; a third silicon carbide region of the second-conductivity type sandwiching the trench with the second silicon carbide region; a sixth silicon carbide region of the second-conductivity type being in contact with the second side face and the bottom face; a gate electrode; and an insulating layer between the gate electrode and the second silicon carbide region, in which a portion of the first side face being in contact with the first silicon carbide region includes a first, second, and third region, and inclination angle of the second region is shallower than those of the first and third regions.

18 Claims, 28 Drawing Sheets

SEMICONDUCTOR DEVICE, METHOD FOR MANUFACTURING SEMICONDUCTOR DEVICE, INVERTER CIRCUIT, DRIVING DEVICE, VEHICLE, AND ELEVATOR

CROSS-REFERENCE TO RELATED APPLICATION

This application is based upon and claims the benefit of priority from Japanese Patent Application No. 2017-224117, filed on Nov. 22, 2017, the entire contents of which are incorporated herein by reference.

FIELD

Embodiments described herein relate generally to a semiconductor device, a method for manufacturing a semiconductor device, an inverter circuit, a driving device, a vehicle, and an elevator.

BACKGROUND

Silicon carbide is expected as a material for next generation semiconductor devices. Silicon carbide has superior physical properties such as a band gap of about 3 times, a breakdown field strength of about 10 times, and a thermal conductivity of about 3 times of silicon. By utilizing the physical properties, a semiconductor device with low loss and high temperature operation can be achieved.

As a structure for reducing on-resistance of a metal oxide semiconductor field effect transistor (MOSFET) using silicon carbide, there is a trench gate type MOSFET in which a gate electrode is provided in a trench. In the trench gate type MOSFET, the on-resistance is reduced by increasing a channel density per unit area. Further reduction of the on-resistance in the trench gate type MOSFET is expected.

DETAILED DESCRIPTION

Figure 1:
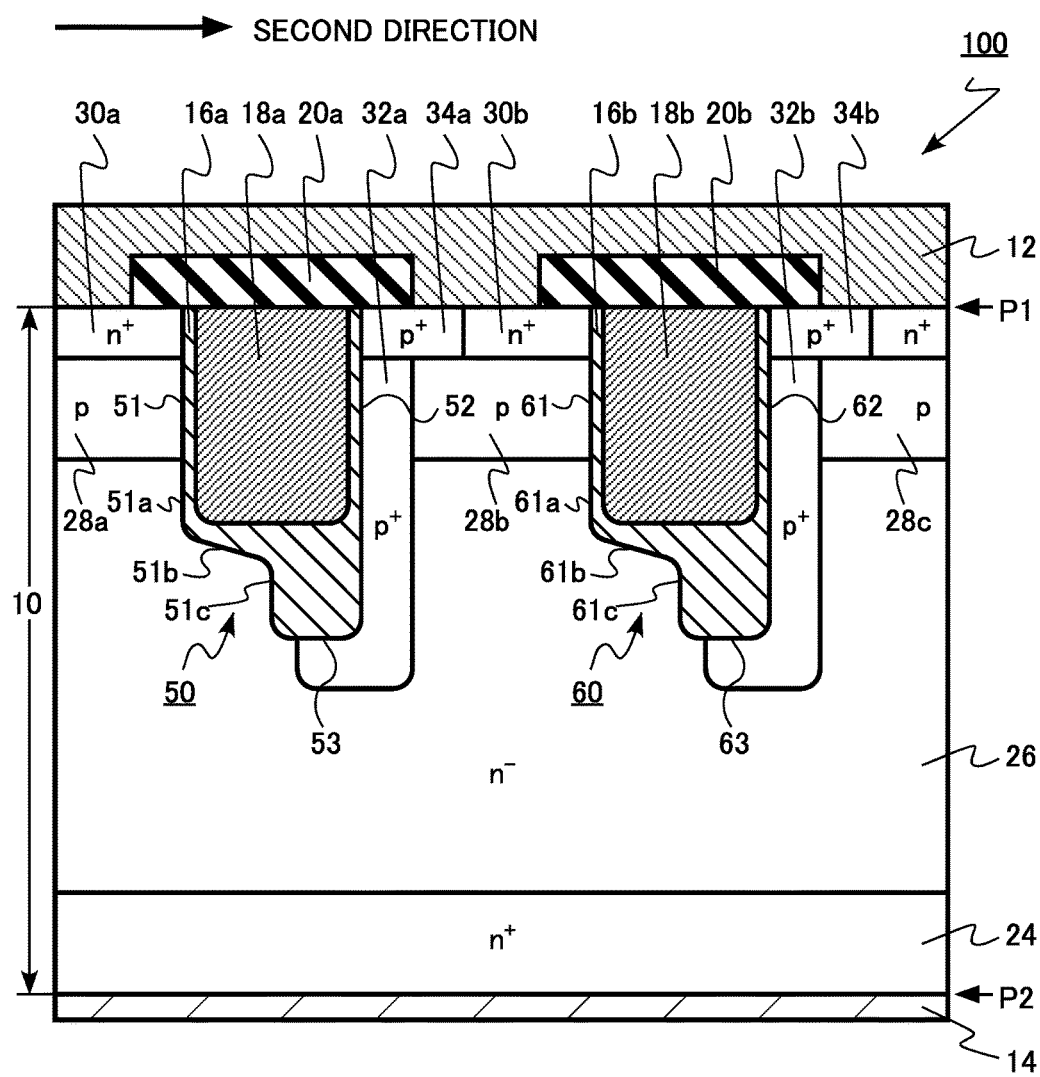
FIG. 1 is a schematic sectional view of a semiconductor device of a first embodiment.

A semiconductor device according to an embodiment includes a silicon carbide layer including a first plane and a second plane; a first electrode located on the first plane; a second electrode located on the second plane; a trench existing in the silicon carbide layer and including a first side face, a second side face, and a bottom face between the first side face and the second side face; a first silicon carbide region of a first-conductivity type located in the silicon carbide layer and being in contact with the first side face; a second silicon carbide region of a second-conductivity type located in the silicon carbide layer, the second silicon carbide region located between the first silicon carbide region and the first plane, and the second silicon carbide region being in contact with the first side face; a third silicon carbide region of the second-conductivity type located in the silicon carbide layer, the third silicon carbide region located between the first silicon carbide region and the first plane, and the trench being interposed between the third silicon carbide region and the second silicon carbide region; a fourth silicon carbide region of the first-conductivity type located in the silicon carbide layer, the fourth silicon carbide region located between the second silicon carbide region and the first plane, and the fourth silicon carbide region being in contact with the first side face; a fifth silicon carbide region of the first-conductivity type located in the silicon carbide layer, the fifth silicon carbide region located between the third silicon carbide region and the first plane, and the trench being interposed between the fifth silicon carbide region and the fourth silicon carbide region; a sixth silicon carbide region of the second-conductivity type located in the silicon carbide layer, the sixth silicon carbide region being in contact with the second side face and the bottom face, and the sixth silicon carbide region having a second-conductivity type impurity concentration higher than a second-conductivity type impurity concentration in the third silicon carbide region; a gate electrode located between the first side face and the second side face; and an insulating layer located between the gate electrode and the first silicon carbide region, the gate electrode and the second silicon carbide region, the gate electrode and the third silicon carbide region, and the gate electrode and the sixth silicon carbide region, wherein a portion of the first side face being in contact with the first silicon carbide region includes a first region having a first inclination angle with respect to the first plane, a second region being closer to the second plane than the first region and having a second inclination angle smaller than the first inclination angle with respect to the first plane, and a third region being closer to the second plane than the second region and having a third inclination angle larger than the second inclination angle with respect to the first plane.

Hereinafter, embodiments of the present disclosure will be described with reference to the drawings. In the following description, the same or similar members and the like are denoted by the same reference numerals, and the explanation of the members and the like once described is omitted as appropriate.

In the following description, notations n+, n, n− and p+, p, p− represent relative high/low of the impurity concentration in each conductivity type. That is, it is indicated that an n-type impurity concentration is relatively higher in n+ than in n, and the n-type impurity concentration is relatively lower in n− than in n. In addition, it is indicated that a p-type impurity concentration is relatively higher in p+ than in p, and the p-type impurity concentration is relatively lower in p− than in p. Note that, in some cases, the n+-type and n−-type are simply described as n-type, and p+-type and p−-type are simply described as p-type.

The impurity concentration can be measured by Secondary Ion Mass Spectrometry (SIMS), for example. The relative high/low of the impurity concentration can also be determined from high/low of a carrier concentration obtained by, for example, Scanning Capacitance Microscopy (SCM). A distance such as a depth of an impurity region can be obtained by SIMS, for example. A distance such as a width or depth of the impurity region can be obtained from an SCM image, for example.

A shape of the trench, a thickness of the insulating layer, and the like can be measured on, for example, a Transmission Electron Microscope (TEM) image.

First Embodiment

A semiconductor device of a first embodiment includes: a silicon carbide layer including a first plane and a second plane; a first electrode located on a side of the first plane of the silicon carbide layer; a second electrode located on a side of the second plane of the silicon carbide layer; a trench existing in the silicon carbide layer and including a first side face, a second side face, and a bottom face between the first side face and the second side face; a first silicon carbide region of a first-conductivity type located in the silicon carbide layer and being in contact with the first side face; a second silicon carbide region of a second-conductivity type located in the silicon carbide layer, located between the first silicon carbide region and the first plane, and being in contact with the first side face; a third silicon carbide region of the second-conductivity type located in the silicon carbide layer, located between the first silicon carbide region and the first plane, and sandwiching the trench with the second silicon carbide region; a fourth silicon carbide region of the first-conductivity type located in the silicon carbide layer, located between the second silicon carbide region and the first plane, and being in contact with the first side face; a fifth silicon carbide region of the first-conductivity type located in the silicon carbide layer, located between the third silicon carbide region and the first plane, and sandwiching the trench with the fourth silicon carbide region; a sixth silicon carbide region of the second-conductivity type located in the silicon carbide layer, being in contact with the second side face and the bottom face, and having a second-conductivity type impurity concentration higher than a second-conductivity type impurity concentration in the third silicon carbide region; a gate electrode located between the first side face and the second side face; and an insulating layer located between the gate electrode and the first silicon carbide region, the gate electrode and the second silicon carbide region, the gate electrode and the third silicon carbide region, and the gate electrode and the sixth silicon carbide region. A portion of the first side face being in contact with the first silicon carbide region includes a first region having a first inclination angle with respect to the first plane, a second region closer to the second plane than the first region and having a second inclination angle smaller than the first inclination angle with respect to the first plane, and a third region closer to the second plane than the second region and having a third inclination angle larger than the second inclination angle with respect to the first plane.

FIG. 1 is a schematic sectional view of the semiconductor device of the first embodiment. The semiconductor device of the first embodiment is a trench gate type vertical MOSFET 100 using silicon carbide. In the first embodiment, the first-conductivity type is an n-type, and the second-conductivity type is a p-type. The MOSFET 100 is an n-channel MOSFET using electrons as carriers.

Figure 2:
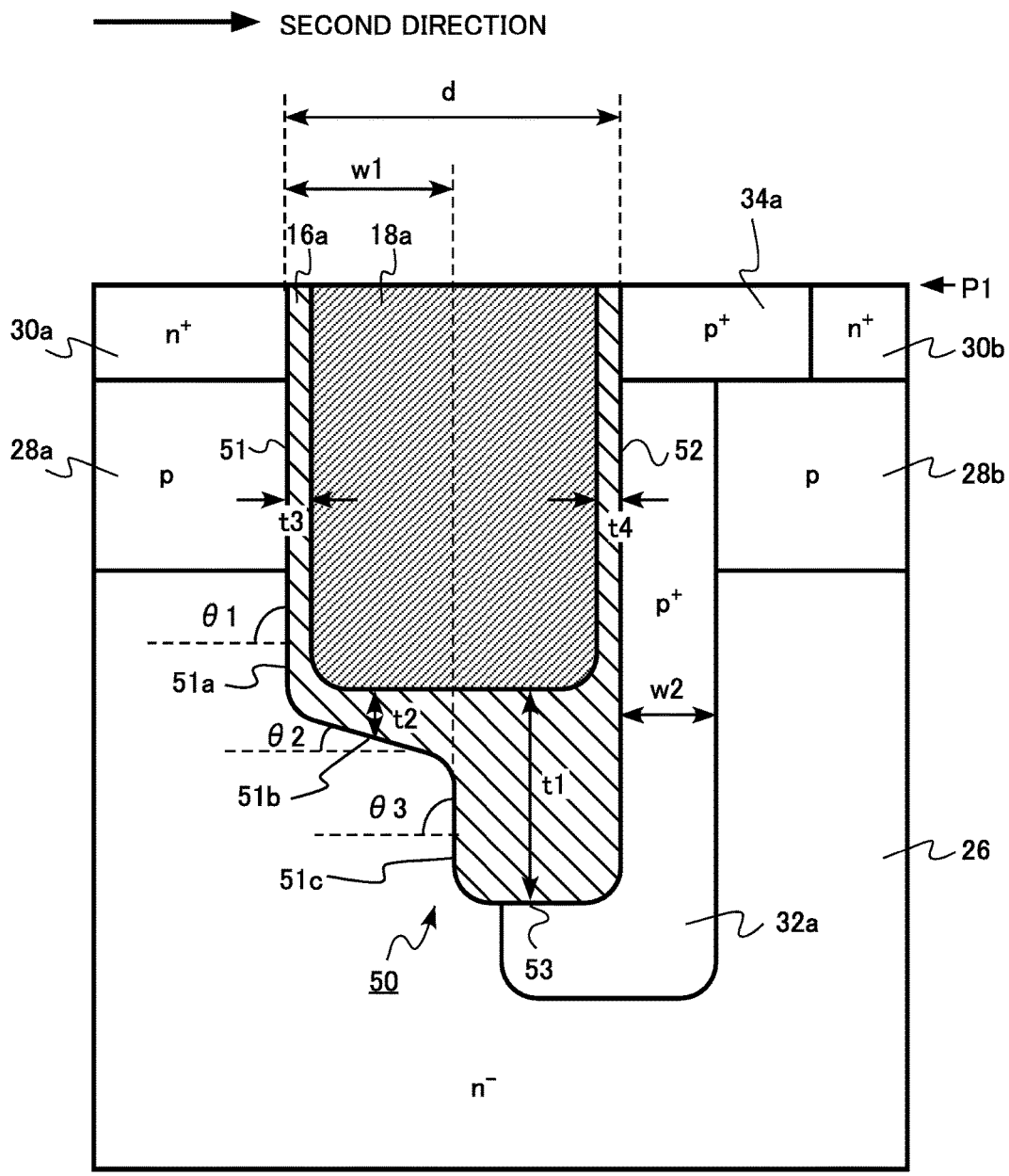
FIG. 2 is an enlarged schematic sectional view of the semiconductor device of the first embodiment.

FIG. 2 is an enlarged schematic sectional view of the semiconductor device of the first embodiment. FIG. 2 is a view illustrating a unit cell of the MOSFET 100. In the MOSFET 100, the unit cell illustrated in FIG. 2 is repeatedly disposed in a second direction at a predetermined pitch.

Figure 3:
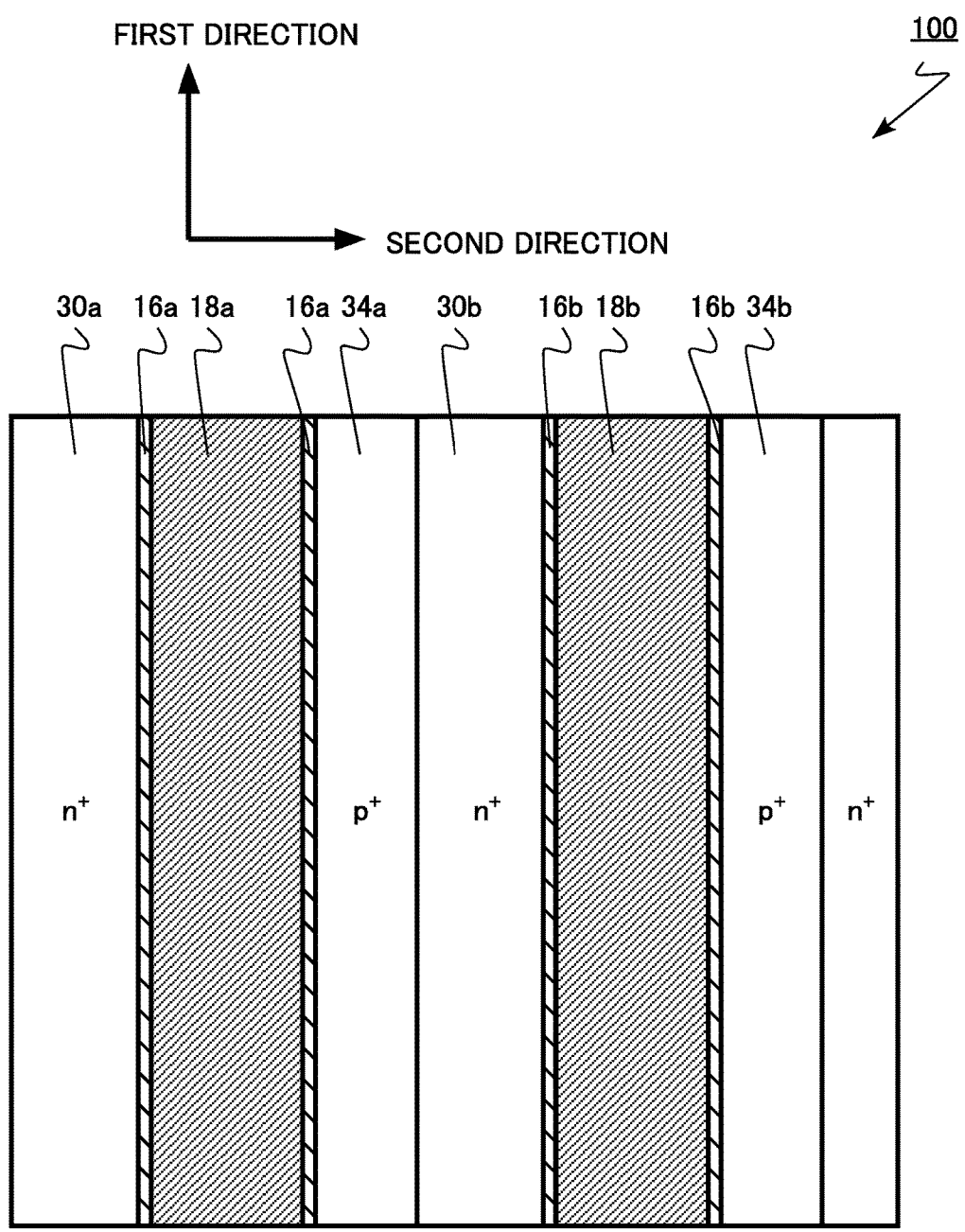
FIG. 3 is a schematic plan view of the semiconductor device of the first embodiment.

FIG. 3 is a schematic plan view of the semiconductor device of the first embodiment. FIG. 3 is a plan view of a first plane (P1 in FIG. 1) of FIG. 1. A first direction and the second direction are parallel to the first plane P1. The second direction is a direction perpendicular to the first direction.

The MOSFET 100 includes a silicon carbide layer 10, a source electrode 12 (first electrode), a drain electrode (second electrode), a first insulating layer 16a (insulating layer), a second insulating layer 16b, a first gate electrode 18a (gate electrode), a second gate electrode 18b, a first interlayer insulating layer 20a, a second interlayer insulating layer 20b, a first trench 50 (trench), and a second trench 60.

In the silicon carbide layer 10, there is provided an n+-type drain region 24, an n−-type drift region 26 (first silicon carbide region), a p-type first body region 28a (second silicon carbide region), a p-type second body region 28b (third silicon carbide region), a p-type third body region 28c, an n+-type first source region 30a (fourth silicon carbide region), an n+-type second source region 30b (fifth silicon carbide region), a p+-type first electric field relaxation region 32a (sixth silicon carbide region), a p+-type second electric field relaxation region 32b, a p+-type first contact region 34a, and a p+-type second contact region 34b.

The silicon carbide layer 10 is single crystal SiC. The silicon carbide layer 10 is, for example, 4H—SiC.

The silicon carbide layer 10 includes the first plane ("P1" in FIG. 1) and a second plane ("P2" in FIG. 1). Hereinafter, the first plane is also referred to as a front plane and the second plane is referred to as a back plane. Hereinafter, "depth" means a depth with reference to the first plane P1.

For example, the first plane P1 is a plane inclined by 0 degrees or more and 8 degrees or less with respect to the (0001) face. That is, the first plane P1 is a plane whose normal line is inclined by 0 degrees or more and 8 degrees or less with respect to the c-axis in a [0001] direction. In other words, the off angle with respect to the (0001) face is 0 degrees or more and 8 degrees or less. In addition, the second plane P2 is, for example, a plane inclined by 0 degrees or more and 8 degrees or less with respect to the (000-1) face.

The (0001) face is referred to as a silicon face. The (000-1) face is referred to as a carbon face. An inclination direction of the first plane P1 and the second plane P2 is, for example, a [11-20] direction. The [11-20] direction is an a-axis direction. In FIG. 1, for example, the second direction illustrated in the figure is the a-axis direction.

The first trench 50 and the second trench 60 exist in the silicon carbide layer 10. The first trench 50 and the second trench 60 extend in the first direction as illustrated in FIG. 3. The first trench 50 and the second trench 60 each are a part of the silicon carbide layer 10.

The first trench 50 includes a first side face 51, a second side face 52, and a bottom face 53. The bottom face 53 is located between the first side face 51 and the second side face 52. A portion of the first side face 51 being in contact with the drift region 26 includes a first region 51a having a first inclination angle ("θ1" in FIG. 2) with respect to the first plane P1, a second region 51b having a second inclination angle ("θ2" in FIG. 2) with respect to the first plane P1, and a third region 51c having a third inclination angle ("θ3" in FIG. 2) with respect to the first plane P1. The second inclination angle θ2 is smaller than the first inclination angle θ1. The third inclination angle θ3 is larger than the second inclination angle θ2.

The first inclination angle θ1 is, for example, 80 degrees or more and 90 degrees or less. The second inclination angle θ2 is, for example, 0 degrees or more and 30 degrees or less. The third inclination angle θ3 is, for example, 80 degrees or more and 90 degrees or less.

A width ("w1" in FIG. 2) of the second region 51b of the first trench 50 is, for example, a quarter or more of a maximum distance ("d" in FIG. 2) between the first side face 51 and the second side face 52.

The second trench 60 includes a first side face 61, a second side face 62, and a bottom face 63. The bottom face 63 is located between the first side face 61 and the second side face 62. A portion of the first side face 61 being in contact with the drift region 26 includes a first region 61a having the first inclination angle with respect to the first plane P1, a second region 61b having the second inclination angle with respect to the first plane P1, and a third region 61c having the third inclination angle with respect to the first plane P1. The second inclination angle is smaller than the first inclination angle. The third inclination angle is larger than the second inclination angle. The second trench 60 has a configuration similar to that of the first trench 50.

Each of the first trench 50 and the second trench 60 has different depths in the left and right direction. In the first trench 50 and the second trench 60, the sides of the first side face 51 and the first side face 61 are shallow. The first trench 50 and the second trench 60 each have a left-right asymmetric shape.

The n+-type drain region 24 is provided on the back plane side of the silicon carbide layer 10. The drain region 24 contains, for example, nitrogen (N) as an n-type impurity. An impurity concentration of the n-type impurity in the drain region 24 is, for example, $1\times10^{18}$ cm$^{-3}$ or more and $1\times10^{21}$ cm$^{-3}$ or less.

The n−-type drift region 26 is provided on the drain region 24. The drift region 26 is in contact with the first side face 51 and the first side face 61. The drift region 26 contains, for example, nitrogen (N) as the n-type impurity. An impurity concentration of the n-type impurity in the drift region 26 is lower than the impurity concentration of the n-type impurity in the drain region 24. The impurity concentration of the n-type impurity in the drift region 26 is, for example, $4\times10^{14}$ cm$^{-3}$ or more and $1\times10^{19}$ cm$^{-3}$ or less. A thickness of the drift region 26 is, for example, 5 μm or more and 150 μm or less.

The p-type first body region 28a is provided between the drift region 26 and the front plane of the silicon carbide layer 10. The first body region 28a is in contact with the first side face 51. The p-type second body region 28b is provided between the drift region 26 and the front plane of the silicon carbide layer 10. The first trench 50 is sandwiched between the first body region 28a and the second body region 28b. The second body region 28b is in contact with the first side face 61. The p-type third body region 28c is provided between the drift region 26 and the front plane of the silicon carbide layer 10. The second trench 60 is sandwiched between the second body region 28b and the third body region 28c.

The first body region 28a, the second body region 28b, and the third body region 28c each function as a channel region of the MOSFET 100. For example, during on-operation of the MOSFET 100, a channel in which electrons flow is formed in a region being in contact with the first insulating layer 16a of the first body region 28a and a region being in contact with the second insulating layer 16b in the second body region 28b. The region being in contact with the first insulating layer 16a of the first body region 28a and the region being in contact with the second insulating layer 16b in the second body region 28b each become a channel formation region.

In the MOSFET 100, only one side of the first trench 50, that is, the first side face 51 side becomes the channel formation region. In the MOSFET 100, only one side of the second trench 60, that is, the first side face 61 side becomes the channel formation region.

The first body region 28a, the second body region 28b, and the third body region 28c each contain, for example, aluminum (Al) as a p-type impurity. An impurity concentration of the p-type impurity in each of the first body region 28a, the second body region 28b, and the third body region 28c is, for example, $5\times10^{16}$ cm$^{-3}$ or more and $5\times10^{17}$ cm$^{-3}$ or less.

A depth of each of the first body region 28a, the second body region 28b, and the third body region 28c is, for example, 0.2 µm or more and 1.0 µm or less.

The n$^+$-type first source region 30a is provided between the first body region 28a and the front plane of the silicon carbide layer 10. The first source region 30a is in contact with the source electrode 12. The first source region 30a is in contact with the first insulating layer 16a.

The n$^+$-type second source region 30b is provided between the second body region 28b and the front plane of the silicon carbide layer 10. The second source region 30b is in contact with the source electrode 12. The second source region 30b is in contact with the second insulating layer 16b.

The first source region 30a and the second source region 30b each contain, for example, phosphorus (P) as an n-type impurity. An impurity concentration of the n-type impurity in each of the first source region 30a and the second source region 30b is higher than the impurity concentration of the n-type impurity in the drift region 26.

The impurity concentration of the n-type impurity in each of the first source region 30a and the second source region 30b is, for example, $1 \times 10^{19}$ cm$^{-3}$ or more and $1 \times 10^{21}$ cm$^{-3}$ or less. A depth of each of the first source region 30a and the second source region 30b is shallower than the depth of each of the first body region 28a, the second body region 28b, and the third body region 28c, and is, for example, 0.1 µm or more and 0.3 µm or less. Each distance from the drift region 26 to the first source region 30a and the second source region 30b is, for example, 0.1 µm or more and 0.9 µm or less.

The p$^+$-type first contact region 34a is provided between the second body region 28b and the front plane of the silicon carbide layer 10. The first contact region 34a is in contact with the source electrode 12.

The p$^+$-type second contact region 34b is provided between the third body region 28c and the front plane of the silicon carbide layer 10. The second contact region 34b is in contact with the source electrode 12.

The first contact region 34a and the second contact region 34b each contain, for example, aluminum (Al) as the p-type impurity. An impurity concentration of the p-type impurity in each of the first contact region 34a and the second contact region 34b is higher than, for example, the impurity concentration of the p-type impurity in each of the first body region 28a, the second body region 28b, and the third body region 28c.

The impurity concentration of the p-type impurity in each of the first contact region 34a and the second contact region 34b is, for example, $1 \times 10^{18}$ cm$^{-3}$ or more and $1 \times 10^{21}$ cm$^{-3}$ or less. In addition, a contact portion with the source electrode 12 preferably has high concentration, and is, for example, $1 \times 10^{19}$ cm$^{-3}$ or more and $1 \times 10^{21}$ cm$^{-3}$ or less.

The p$^+$-type first electric field relaxation region 32a is in contact with the second side face 52 and the bottom face 53 of the first trench 50. The first electric field relaxation region 32a is provided between the drift region 26 and the first trench 50.

A portion of a boundary between the first electric field relaxation region 32a and the drift region 26 facing the second trench 60 has, for example, a shape perpendicular to the first plane P1, or a tapered shape approaching the first trench 50 with an increase in depth. In other words, there is no protrusion protruding toward the second trench at the boundary between the first electric field relaxation region 32a and the drift region 26.

A depth of the first electric field relaxation region 32a is deeper than a depth of the first trench 50. A width ("w2" in FIG. 2) of the first electric field relaxation region 32a between the second side face 52 and the drift region 26 is, for example, 0.2 µm or more and 0.6 µm or less.

The p$^+$-type second electric field relaxation region 32b is in contact with the second side face 62 and the bottom face 63 of the second trench 60. The second electric field relaxation region 32b is provided between the drift region 26 and the second trench 60.

A depth of the second electric field relaxation region 32b is deeper than a depth of the second trench 60. A width of the second electric field relaxation region 32b between the second side face 62 and the drift region 26 is, for example, 0.2 µm or more and 0.6 µm or less. The second electric field relaxation region 32b has a configuration similar to that of the first electric field relaxation region 32a.

The first electric field relaxation region 32a and the second electric field relaxation region 32b each contain, for example, aluminum (Al) as the p-type impurity. An impurity concentration of the p-type impurity in each of the first electric field relaxation region 32a and the second electric field relaxation region 32b is higher than, for example, the impurity concentration of the p-type impurity in each of the first body region 28a, the second body region 28b, and the third body region 28c.

The impurity concentration of the p-type impurity in each of the first electric field relaxation region 32a and the second electric field relaxation region 32b is, for example, $1 \times 10^{18}$ cm$^{-3}$ or more and $1 \times 10^{21}$ cm$^{-3}$ or less.

A potential of each of the first electric field relaxation region 32a and the second electric field relaxation region 32b is fixed to a source potential. The first electric field relaxation region 32a has a function of relaxing an electric field applied to the second insulating layer 16b. In particular, the electric field is relaxed applied to the second insulating layer 16b provided on a corner between the first region 61a and the second region 61b of the second trench 60. Similarly to the first electric field relaxation region 32a, also the second electric field relaxation region 32b has a function of relaxing an electric field applied to an adjacent insulating layer (not illustrated).

The first gate electrode 18a is provided between the first side face 51 and the second side face 52 of the first trench 50. The first gate electrode 18a is provided inside the first trench 50. The first gate electrode 18a is provided between the source electrode 12 and the drain electrode 14. The first gate electrode 18a is provided on the first insulating layer 16a. The first gate electrode 18a extends in the first direction.

The second gate electrode 18b is provided between the first side face 61 and the second side face 62 of the second trench 60. The second gate electrode 18b is provided inside the second trench 60. The second gate electrode 18b is provided between the source electrode 12 and the drain electrode 14. The second gate electrode 18b is provided on the second insulating layer 16b. The second gate electrode 18b extends in the first direction.

The first gate electrode 18a and the second gate electrode 18b are conductive layers. The first gate electrode 18a and the second gate electrode 18b each are, for example, polycrystalline silicon containing the p-type impurity or the n-type impurity.

The first insulating layer 16a is provided between the first gate electrode 18a and each of regions of the first source region 30a, the first body region 28a, the drift region 26, the first electric field relaxation region 32a, and the first contact region 34a. The first insulating layer 16a between the first body region 28a and the first gate electrode 18a functions as a gate insulating layer of the MOSFET 100.

A thickness ("t1" in FIG. 2) of the first insulating layer 16a between the first gate electrode 18a and the bottom face 53 of the first trench 50 is thicker than, for example, a thickness ("t2" in FIG. 2) of the first insulating layer 16a between the first gate electrode 18a and the second region 51b of the first trench 50. The thickness t1 of the first insulating layer 16a between the first gate electrode 18a and the bottom face 53 of the first trench 50 is, for example, three times or more of the thickness t2 of the first insulating layer 16a between the first gate electrode 18a and the second region 51b of the first trench 50. The thickness t2 of the first insulating layer 16a between the first gate electrode 18a and the second region 51b of the first trench 50 is represented by a value of a thickness at an intermediate point of the second region 51b.

A thickness ("t4" in FIG. 2) of the first insulating layer 16a between the first gate electrode 18a and the first electric field relaxation region 32a is thicker than, for example, a thickness ("t3" in FIG. 2) of the first insulating layer 16a between the first gate electrode 18a and the first body region 28a.

The second insulating layer 16b is provided between the second gate electrode 18b and each of regions of the second source region 30b, the second body region 28b, the drift region 26, the second electric field relaxation region 32b, and the second contact region 34b. The second insulating layer 16b has a configuration and function similar to those of the first insulating layer 16a.

The first insulating layer 16a and the second insulating layer 16b are, for example, silicon oxide films. For example, a High-k insulating film (high dielectric constant insulating film such as HfSiON, ZrSiON, AlON) can be applied to the first insulating layer 16a and the second insulating layer 16b. In addition, a stacked film of a silicon oxide film ($SiO_2$) and a high-K insulating film can also be applied.

The first interlayer insulating layer 20a is provided on the first gate electrode 18a. The first interlayer insulating layer 20a is, for example, a silicon oxide film.

The second interlayer insulating layer 20b is provided on the second gate electrode 18b. The second interlayer insulating layer 20b is, for example, a silicon oxide film.

The source electrode 12 is provided on the front plane of the silicon carbide layer 10. The source electrode 12 is in contact with the first source region 30a, the second source region 30b, the first contact region 34a, and the second contact region 34b.

The source electrode 12 contains a metal. The metal forming the source electrode 12 is, for example, a stacked structure of titanium (Ti) and aluminum (Al). The source electrode 12 may contain metal silicide or metal carbide being in contact with the silicon carbide layer 10.

The drain electrode 14 is provided on the back plane of the silicon carbide layer 10. The drain electrode 14 is in contact with the drain region 24.

The drain electrode 14 is, for example, a metal or a metal semiconductor compound. The drain electrode 14 contains, for example, a material selected from a group consisting of nickel silicide (NiSi), titanium (Ti), nickel (Ni), silver (Ag), and gold (Au).

Next, an example will be described of a method for manufacturing the semiconductor device of the first embodiment.

A method for manufacturing a semiconductor device of the first embodiment includes: forming, in a silicon carbide layer including a first plane and a second plane and including a first silicon carbide region of a first-conductivity type, a second silicon carbide portion of a second-conductivity type located between the first silicon carbide region and the first plane, and a third silicon carbide portion of the first-conductivity type located between the second silicon carbide portion and the first plane; etching the silicon carbide layer from a side of the first plane to form a trench including a first side face, a second side face, and a bottom face between the first side face and the second side face, in which a portion of the first side face being in contact with the first silicon carbide region includes a first region having a first inclination angle with respect to the first plane, a second region closer to the second plane than the first region and having a second inclination angle smaller than the first inclination angle with respect to the first plane, and a third region closer to the second plane than the second region and having a third inclination angle larger than the second inclination angle with respect to the first plane; forming, in the silicon carbide layer, a fourth silicon carbide portion of the second-conductivity type being in contact with the second side face and the bottom face and having a second-conductivity type impurity concentration higher than a second-conductivity type impurity concentration in the second silicon carbide portion, by oblique ion implantation of the second-conductivity type impurity; forming an insulating layer inside the trench; forming a gate electrode on the insulating layer; forming a first electrode on the side of the first plane of the silicon carbide layer; and forming a second electrode on a side of the second plane of the silicon carbide layer.

FIGS. 4 to 12 are schematic sectional views illustrating the example of the method for manufacturing the semiconductor device of the first embodiment.

Figure 4:
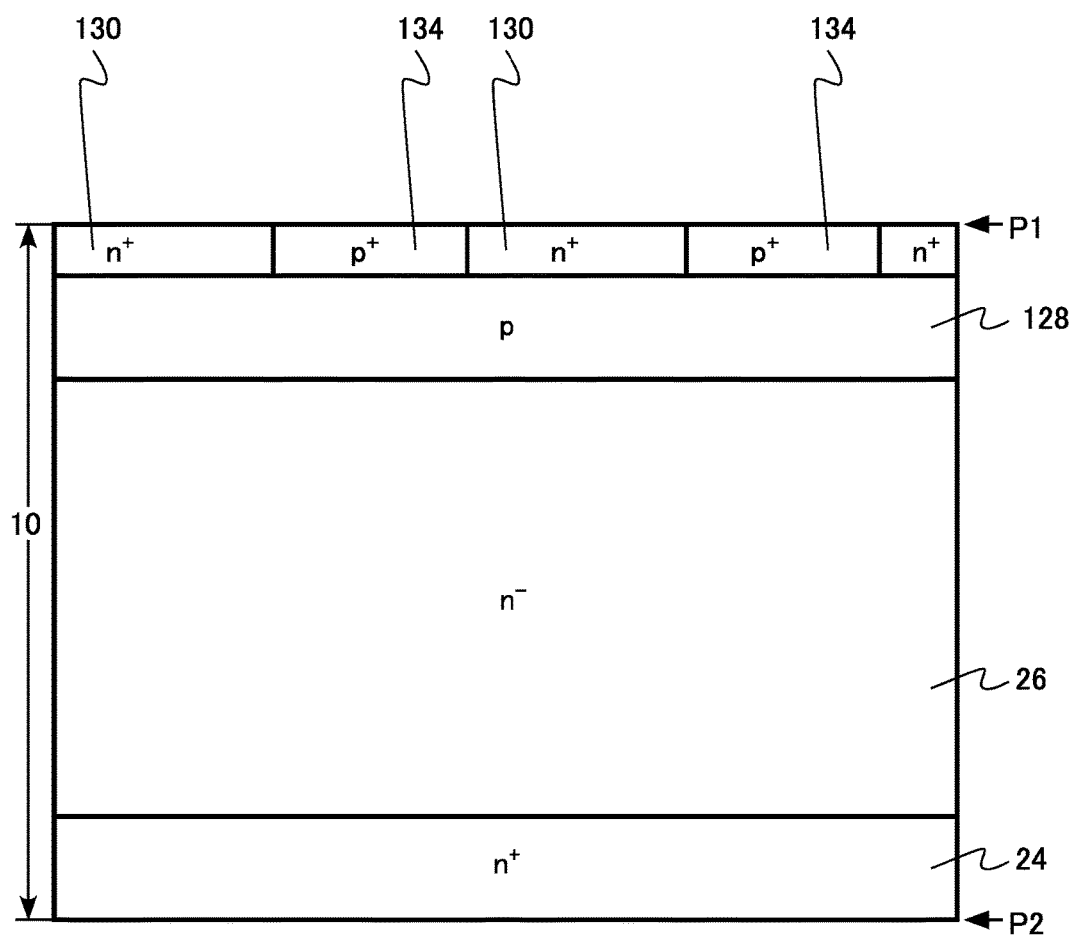
FIG. 4 is a schematic sectional view illustrating an example of a method for manufacturing the semiconductor device of the first embodiment.

First, the silicon carbide layer 10 is prepared including the first plane P1 and the second plane P2 and including the $n^+$-type drain region 24 and the $n^-$-type drift region 26 (first silicon carbide region). Next, a p-type second silicon carbide portion 128, an $n^+$-type third silicon carbide portion 130, and a $p^+$-type fifth silicon carbide portion 134 are formed in the silicon carbide layer 10 (FIG. 4). The third silicon carbide portion 130 is located between the second silicon carbide portion 128 and the first plane P1. The fifth silicon carbide portion 134 is located between the second silicon carbide portion 128 and the first plane P1.

The second silicon carbide portion 128, the third silicon carbide portion 130, and the fifth silicon carbide portion 134 are formed by an ion implantation method, for example. The second silicon carbide portion 128 finally becomes the first body region 28a, the second body region 28b, and the third body region 28c. The third silicon carbide portion 130 finally becomes the first source region 30a and the second source region 30b. The fifth silicon carbide portion 134 finally becomes the first contact region 34a and the second contact region 34b.

Next, a first mask material 70 is formed on the front plane of the silicon carbide layer 10. The first mask material 70 is formed by, for example, deposition by a Chemical Vapor Deposition (CVD) method and patterning by a lithography method and a Reactive Ion Etching (RIE) method. The first mask material 70 is, for example, a silicon nitride film.

Figure 5:
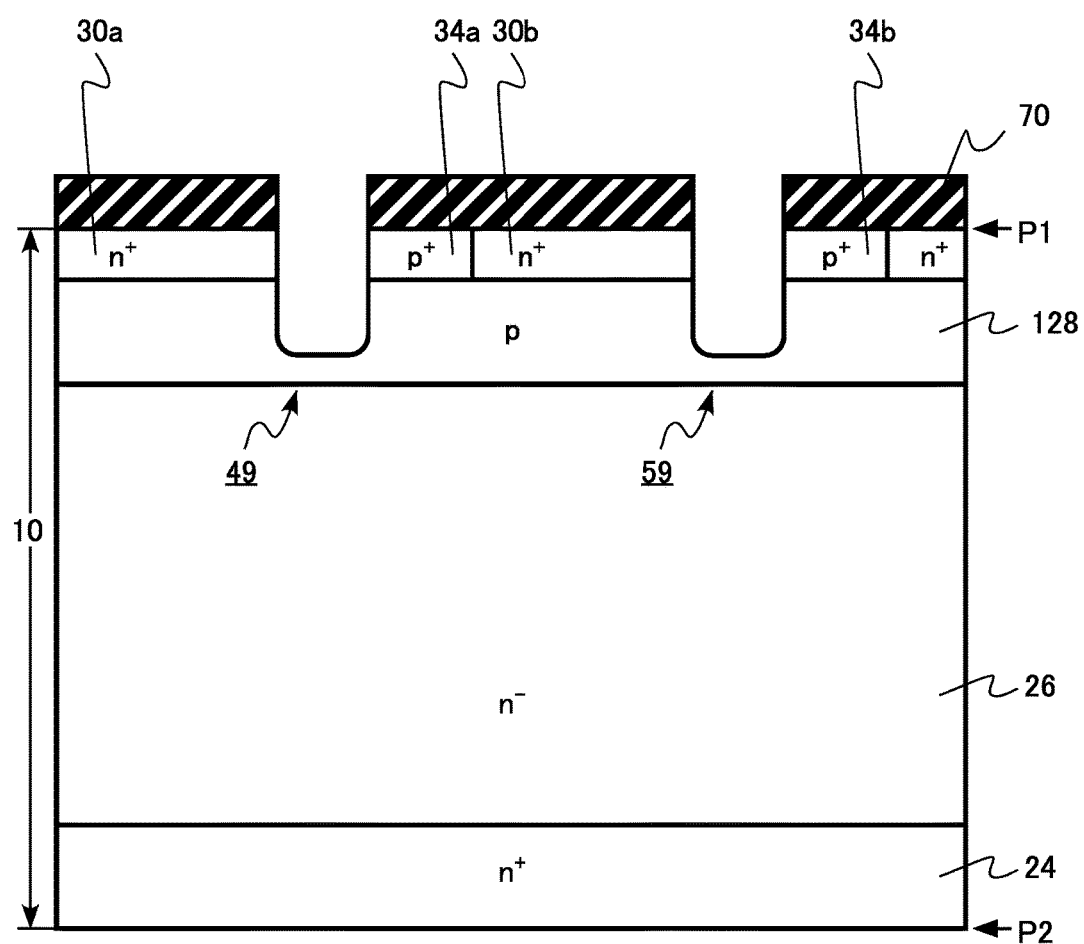
FIG. 5 is a schematic sectional view illustrating the example of the method for manufacturing the semiconductor device of the first embodiment.

Next, using the first mask material 70 as a mask, a first preliminary trench 49 and a second preliminary trench 59 are formed by the RIE method (FIG. 5). A depth of each of the first preliminary trench 49 and the second preliminary trench 59 is shallower than, for example, a depth of the second silicon carbide portion 128.

Figure 6:
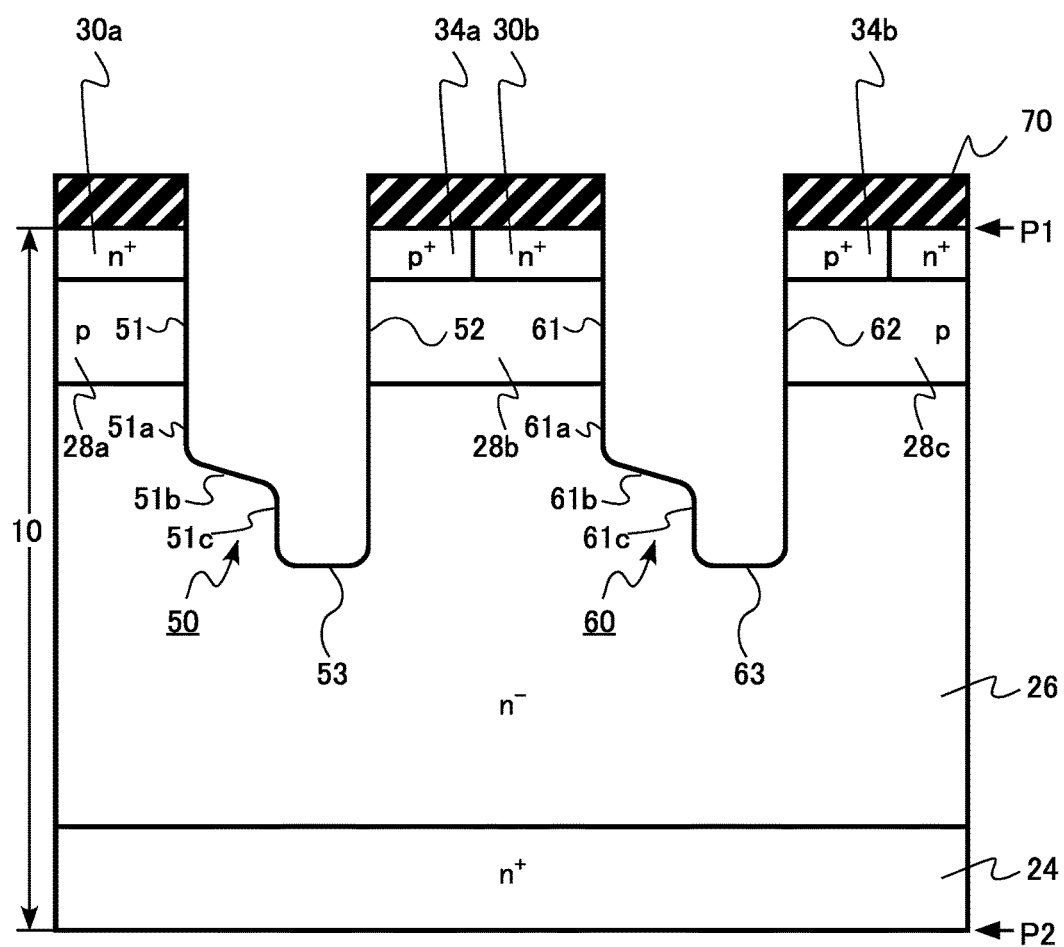
FIG. 6 is a schematic sectional view illustrating the example of the method for manufacturing the semiconductor device of the first embodiment.

Next, after removing a part of the first mask material 70 by the RIE method, the first trench 50 and the second trench 60 are formed by the RIE method (FIG. 6). A depth of a portion corresponding to each of the first preliminary trench 49 and the second preliminary trench 59 is deeper than depths of other portions.

The first trench 50 includes the first side face 51, the second side face 52, and the bottom face 53. The bottom face 53 is located between the first side face 51 and the second side face 52. The portion of the first side face 51 being in contact with the drift region 26 includes the first region 51a having the first inclination angle with respect to the first plane P1, the second region 51b having the second inclination angle with respect to the first plane P1, and the third region 51c having the third inclination angle with respect to the first plane P1. The second inclination angle is smaller than the first inclination angle. The third inclination angle is larger than the second inclination angle.

The second trench 60 includes the first side face 61, the second side face 62, and the bottom face 63. The bottom face 63 is located between the first side face 61 and the second side face 62. The portion of the first side face 61 being in contact with the drift region 26 includes the first region 61a having the first inclination angle with respect to the first plane P1, the second region 61b having the second inclination angle with respect to the first plane P1, and the third region 61c having the third inclination angle with respect to the first plane P1. The second inclination angle is smaller than the first inclination angle. The third inclination angle is larger than the second inclination angle 192. The second trench 60 has a configuration similar to that of the first trench 50.

In the first trench 50 and the second trench 60, the first inclination angle is, for example, 80 degrees or more and 90 degrees or less. The second inclination angle is, for example, 0 degrees or more and 30 degrees or less. The third inclination angle is, for example, 80 degrees or more and 90 degrees or less.

Figure 7:
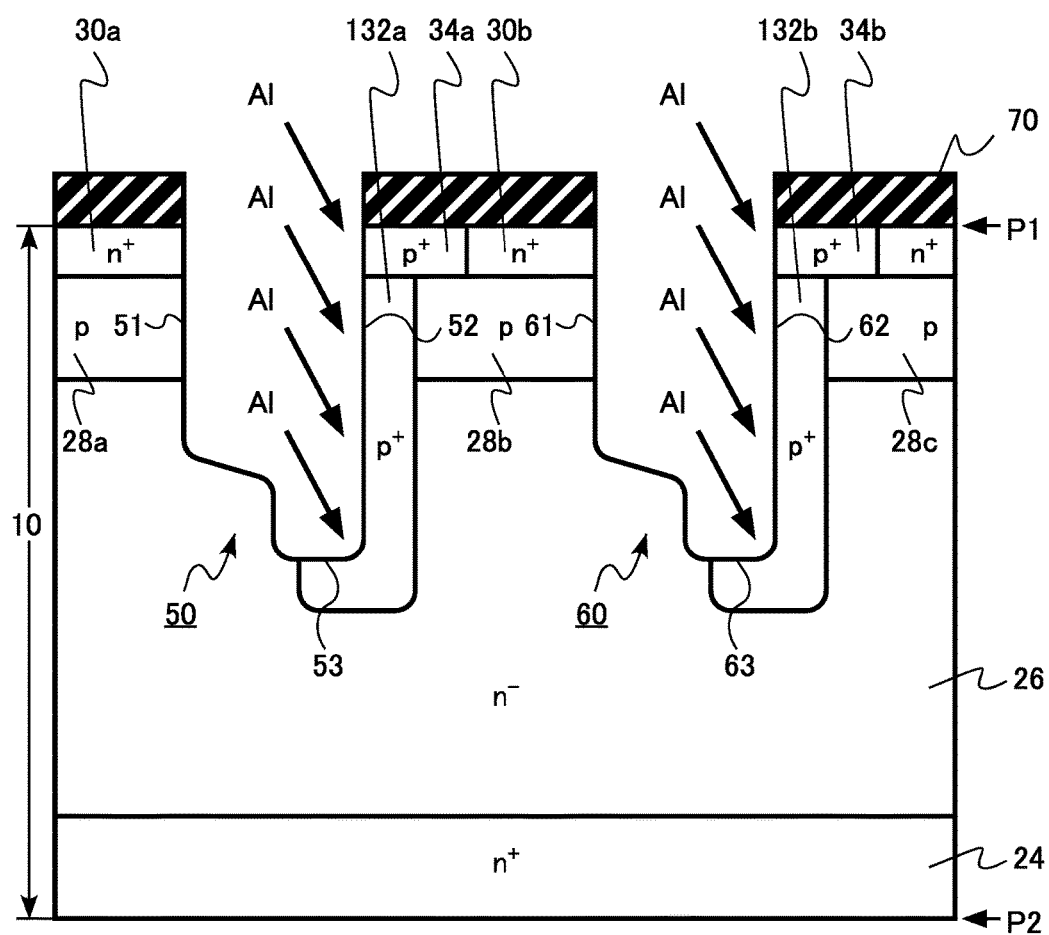
FIG. 7 is a schematic sectional view illustrating the example of the method for manufacturing the semiconductor device of the first embodiment.

Next, in the silicon carbide layer 10, a p-type fourth silicon carbide portion 132a being in contact with the second side face 52 and the bottom face 53 of the first trench 50 and having a p-type impurity concentration higher than a p-type impurity concentration of the second silicon carbide portion 128, is formed by oblique ion implantation of the p-type impurity (FIG. 7).

The fourth silicon carbide portion 132a is formed by the oblique ion implantation of the p-type impurity into the second side face 52 of the first trench 50. The p-type impurity is, for example, aluminum (Al).

An acceleration voltage of the oblique ion implantation is, for example, less than 1 MeV. An angle of an ion implantation direction with respect to a normal direction of the first plane P1 of the silicon carbide layer 10 is, for example, 10 degrees or more and 45 degrees or less.

During formation of the fourth silicon carbide portion 132a, at the same time, a p-type sixth silicon carbide portion 132b is also formed being in contact with the second side face 62 and the bottom face 63 of the second trench 60 and having a p-type impurity concentration higher than the p-type impurity concentration of the second silicon carbide portion 128. The fourth silicon carbide portion 132a and the sixth silicon carbide portion 132b become the first electric field relaxation region 32a and the second electric field relaxation region 32b, respectively.

A width of the fourth silicon carbide portion 132a between the second side face 52 of the first trench 50 and the drift region 26 is, for example, 0.6 μm or less. A width of the sixth silicon carbide portion 132b between the second side face 62 of the second trench 60 and the drift region 26 is, for example, 0.6 μm or less. The p-type impurity concentration of each of the fourth silicon carbide portion 132a and the sixth silicon carbide portion 132b is, for example, $1\times10^{18}$ $cm^{-3}$ or more and $1\times10^{21}$ $cm^{-3}$ or less.

Figure 8:
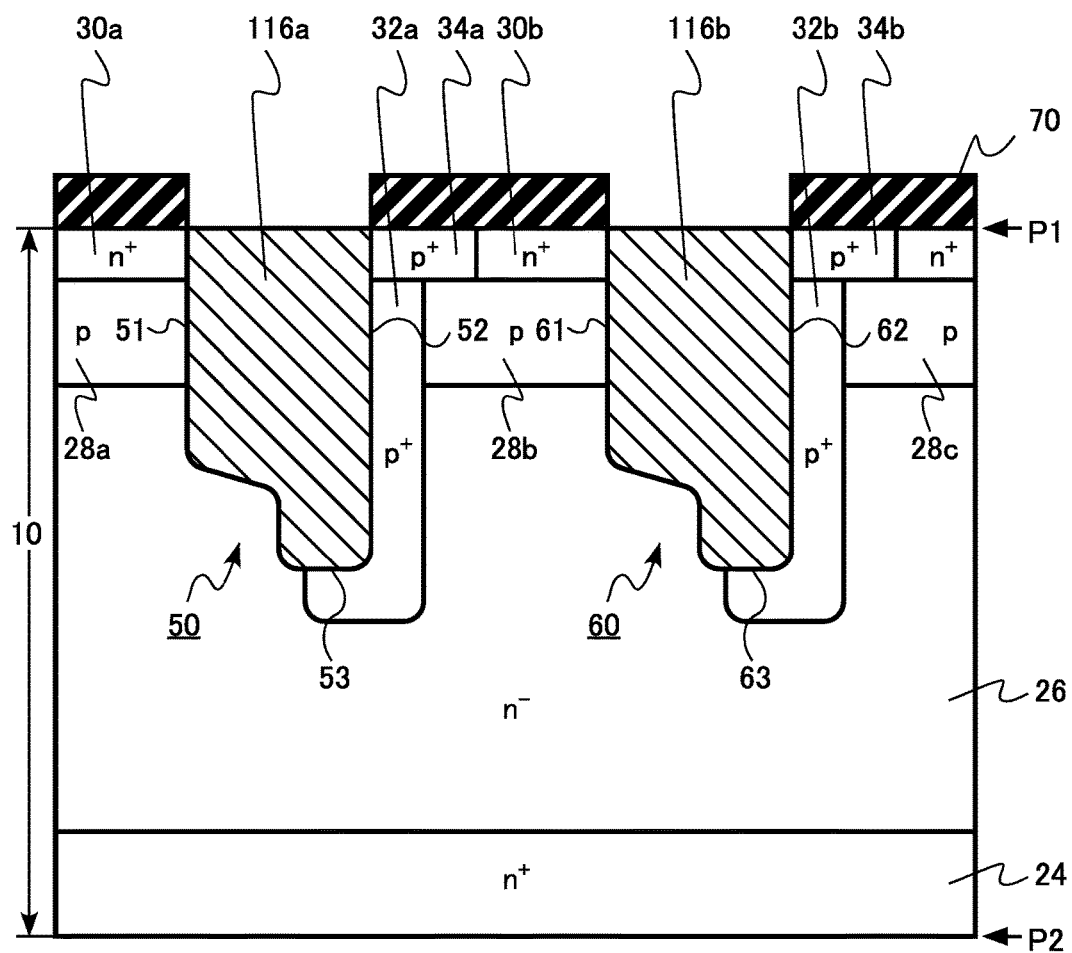
FIG. 8 is a schematic sectional view illustrating the example of the method for manufacturing the semiconductor device of the first embodiment.

Next, the inside of the first trench 50 is filled with an insulating layer 116a, and the inside of the second trench 60 is filled with an insulating layer 116b (FIG. 8). The insulating layer 116a and the insulating layer 116b are, for example, silicon oxide films formed by the CVD method.

Figure 9:
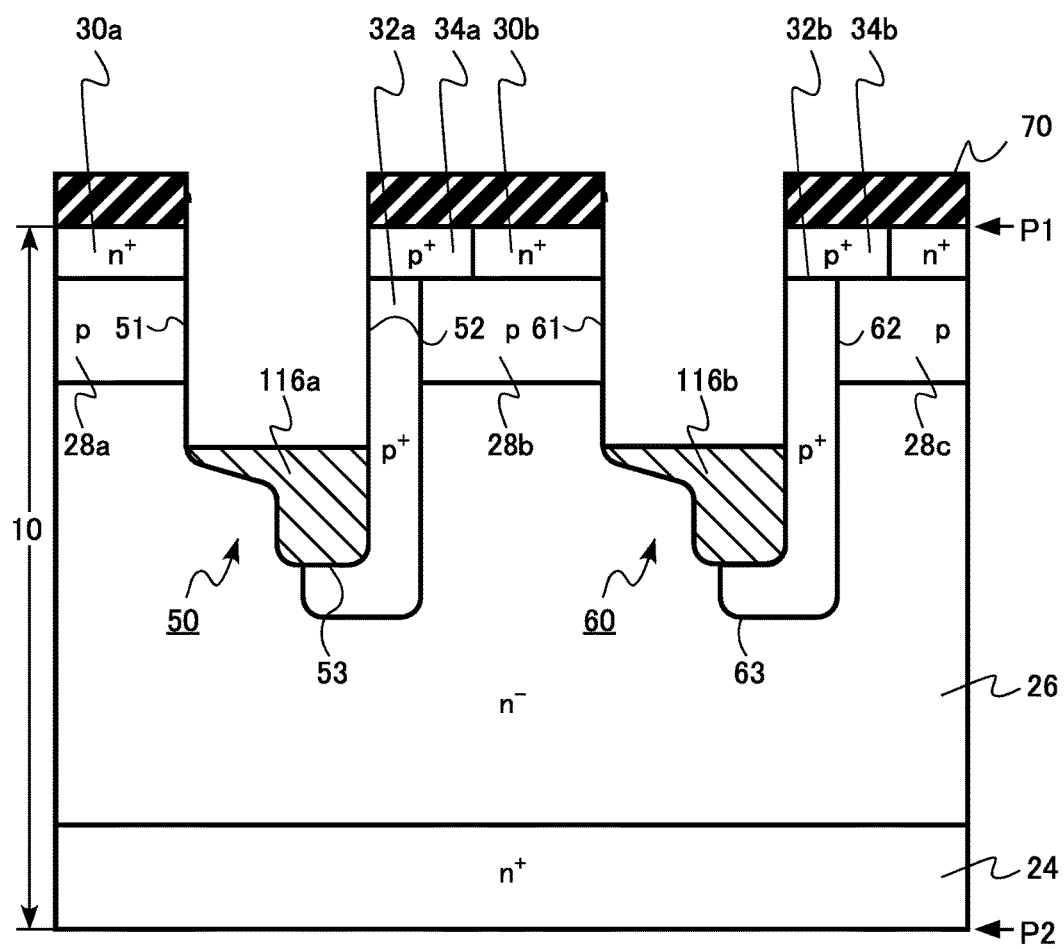
FIG. 9 is a schematic sectional view illustrating the example of the method for manufacturing the semiconductor device of the first embodiment.

Next, a part of the insulating layer 116a in the first trench 50 is removed, and a part of the insulating layer 116b in the second trench 60 is removed (FIG. 9). Removal of the part of the insulating layer 116a and the part of the insulating layer 116b is performed by, for example, a wet etching method.

Figure 10:
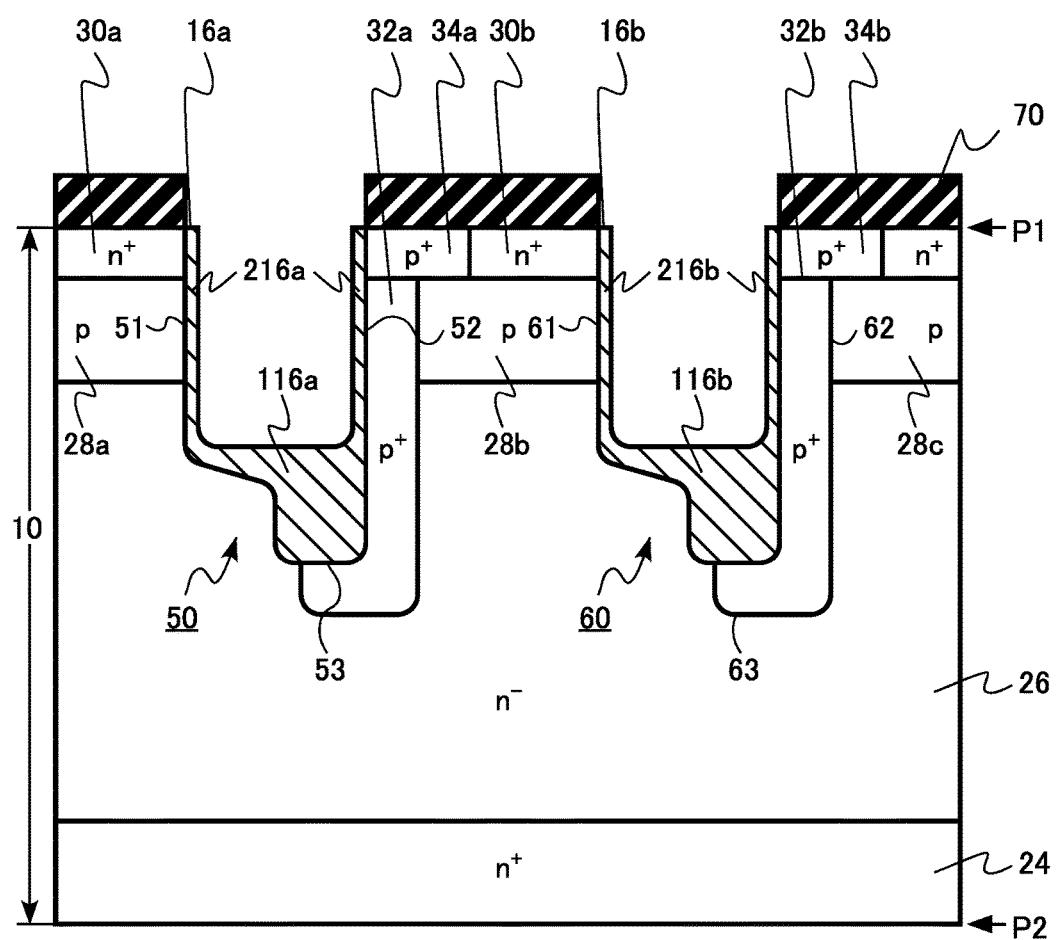
FIG. 10 is a schematic sectional view illustrating the example of the method for manufacturing the semiconductor device of the first embodiment.

Next, an insulating layer 216a is formed on the first side face 51 and second side face 52 of the first trench 50. At the same time, an insulating layer 216b is formed on the first side face 61 and second side face 62 of the second trench 60 (FIG. 10). The insulating layer 216a and the insulating layer 216b are, for example, silicon oxide films formed by a thermal oxidation method or the CVD method.

The insulating layer 116a and the insulating layer 216a configure the first insulating layer 16a formed inside the first trench 50. The insulating layer 116b and the insulating layer 216b configure the second insulating layer 16b formed inside the second trench 60.

Figure 11:
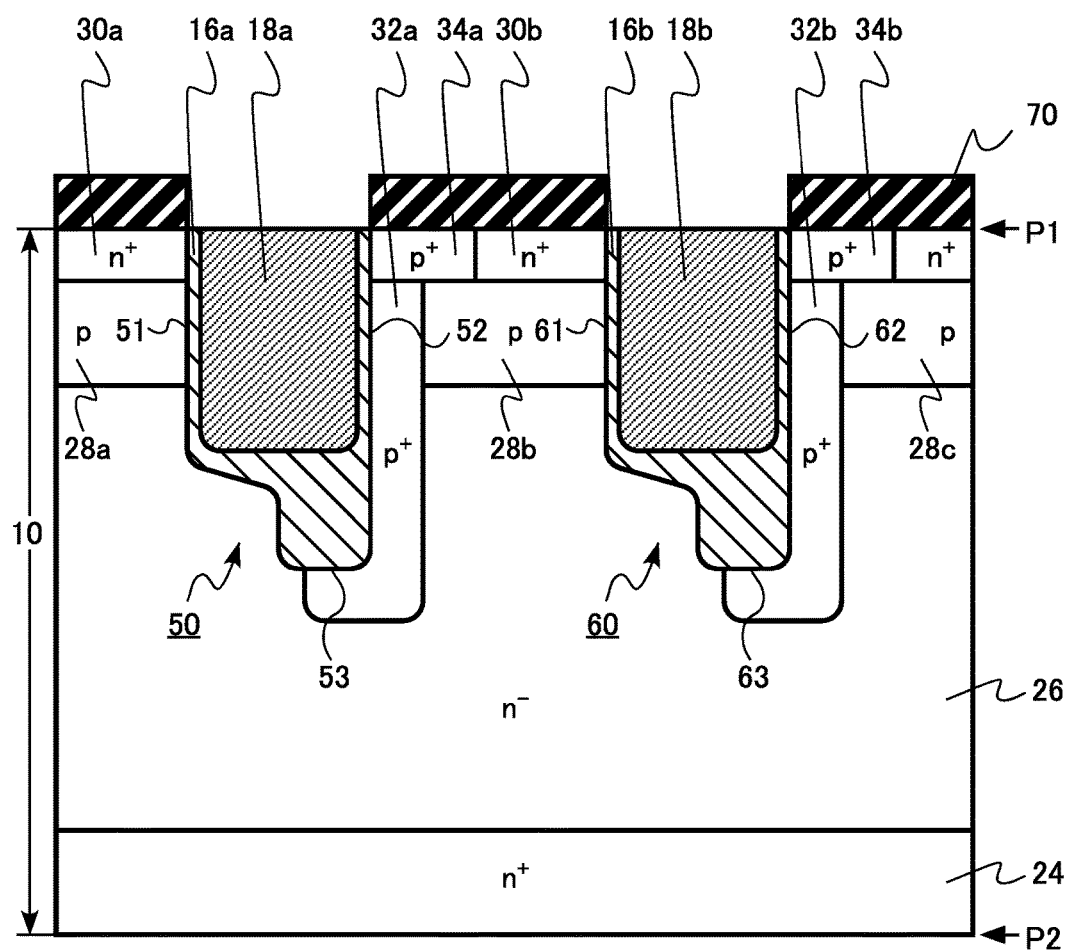
FIG. 11 is a schematic sectional view illustrating the example of the method for manufacturing the semiconductor device of the first embodiment.

Next, the first gate electrode 18a is formed on the first insulating layer 16a. At the same time, the second gate electrode 18b is formed on the second insulating layer 16b (FIG. 11). The first gate electrode 18a and the second gate electrode 18b are, for example, polycrystalline silicon formed by the CVD method.

Figure 12:
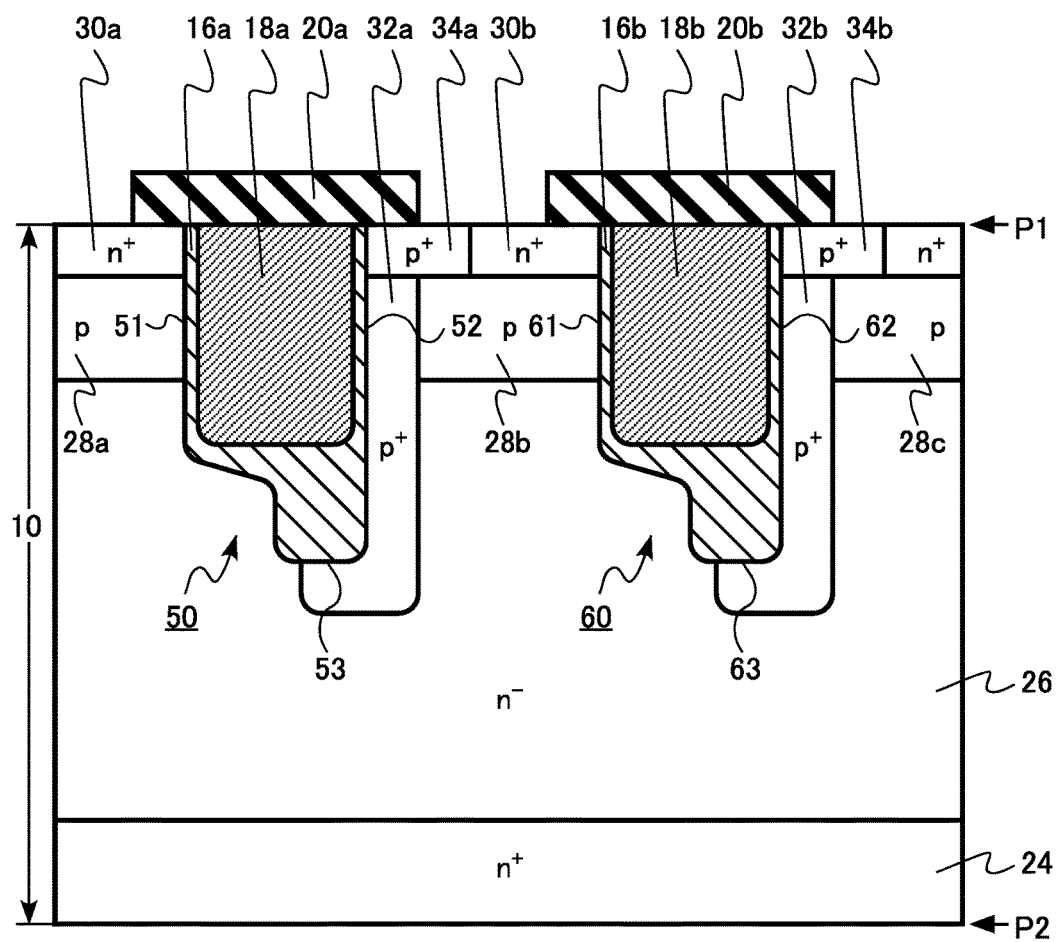
FIG. 12 is a schematic sectional view illustrating the example of the method for manufacturing the semiconductor device of the first embodiment.

Next, the first mask material 70 is removed. Next, the first interlayer insulating layer 20a is formed on the first gate electrode 18a. At the same time, the second interlayer insulating layer 20b is formed on the second gate electrode 18b (FIG. 12). The first interlayer insulating layer 20a and the second interlayer insulating layer 20b are, for example, silicon oxide films formed by the CVD method.

Afterward, the source electrode 12 and the drain electrode 14 are formed using a known process technique. By the above manufacturing method, the MOSFET 100 illustrated in FIG. 1 is manufactured.

Hereinafter, a function and effect will be described of the semiconductor device and the method for manufacturing the semiconductor device of the first embodiment.

The MOSFET 100 of the first embodiment includes the first electric field relaxation region 32a. As a result, electric field strength applied to the second insulating layer 16b during off-operation of the MOSFET 100 is relaxed. Therefore, the dielectric breakdown of the second insulating layer 16b hardly occurs, and reliability of the MOSFET 100 is improved. Further, the first side face 61 of the second trench 60 includes the first region 61a, the second region 61b, and the third region 61c, whereby a current path during the on-operation of the MOSFET 100 expands and on-resistance of the MOSFET 100 is reduced. Details will be described below.

In the trench gate type MOSFET in which the gate electrode is provided in the trench, on-resistance per unit area can be reduced, and on-current can be increased. However, during the off-operation of the MOSFET, the electric field concentrates on the insulating layer in the trench, in particular the insulating layer at the corner of the gate electrode in the trench, so that degradation of reliability of the insulating layer becomes a problem.

The MOSFET 100 of the first embodiment includes the first electric field relaxation region 32*a*. The first electric field relaxation region 32*a* is deeper than the first trench 50 and the second trench 60.

By providing the first electric field relaxation region 32*a*, an electric field distribution in the drift region 26 during the off-operation of the MOSFET 100 is changed, and the electric field strength applied to the second insulating layer 16*b* is relaxed. In particular, the electric field strength is relaxed applied to the second insulating layer 16*b* at the corner of the second gate electrode 18*b*, where the electric field tends to concentrate. Therefore, the dielectric breakdown of the second insulating layer 16*b* hardly occurs, and reliability of the MOSFET 100 is improved.

Figure 13:
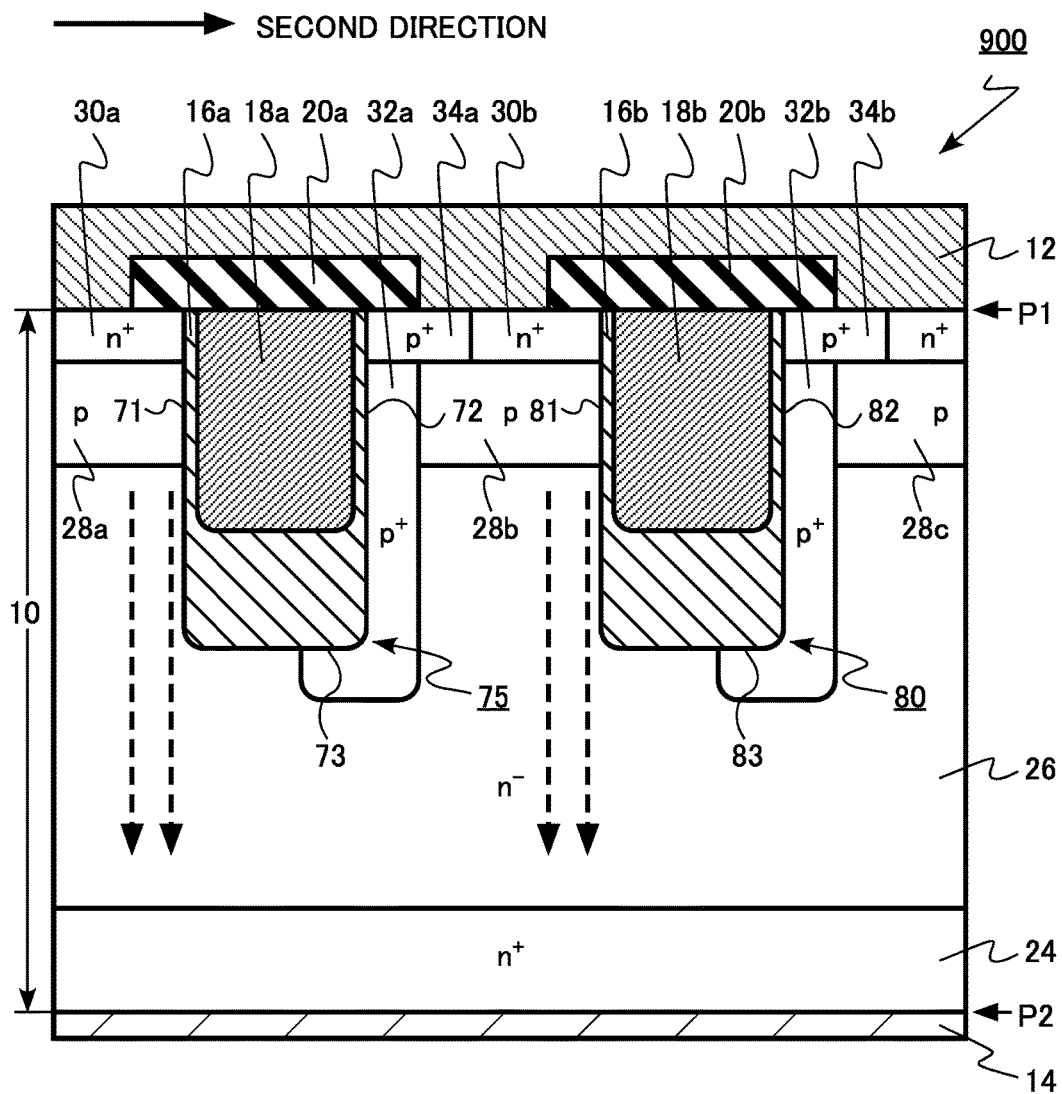
FIG. 13 is an explanatory view of a function and effect of the semiconductor device of the first embodiment.

FIG. 13 is an explanatory view of the function and effect of the semiconductor device of the first embodiment. FIG. 13 is a schematic sectional view of a semiconductor device of a comparative example. The semiconductor device of the comparative example is a trench gate type vertical MOSFET 900. The MOSFET 900 is different from the MOSFET 100 of the first embodiment in that each of a first trench 75 and a second trench 80 has equal depths in the left and right, in other words, each of the first trench 75 and the second trench 80 has a bilaterally symmetrical shape. Except for the shape of the trench, the MOSFET 900 is similar to the MOSFET 100 of the first embodiment.

Also in the MOSFET 900 of the comparative example, by including the first electric field relaxation region 32*a*, the electric field strength applied to the second insulating layer 16*b* is relaxed, and reliability is improved. However, for example, the second trench 80 has the bilaterally symmetrical shape, whereby a width of the drift region 26 between the first electric field relaxation region 32*a* and the second trench 80 narrows. Therefore, a current path (path through which electrons flow) during on-operation of the MOSFET 900 indicated by dotted arrows in FIG. 13 narrows, and on-resistance of the MOSFET 900 increases.

Figure 14:
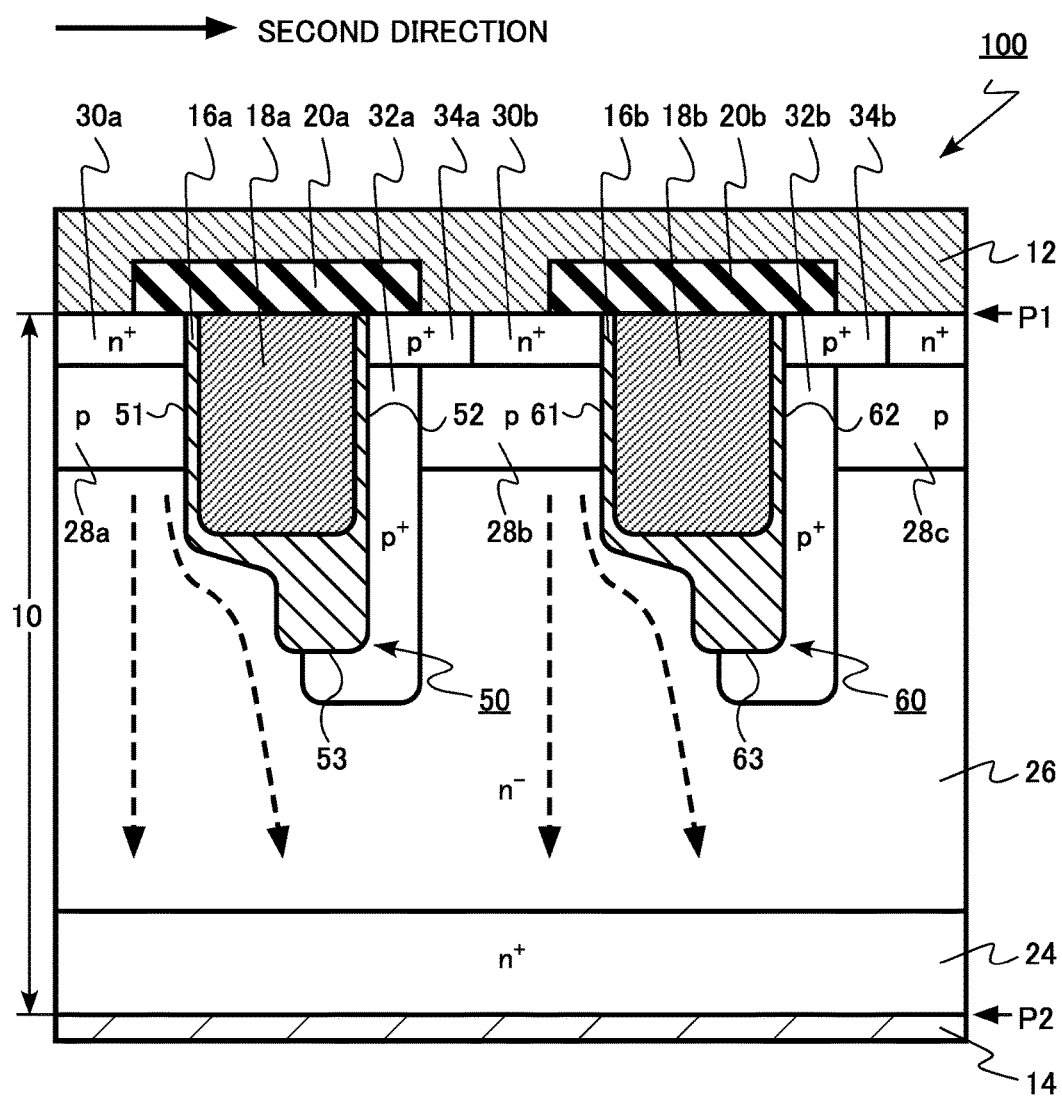
FIG. 14 is an explanatory view of the function and effect of the semiconductor device of the first embodiment.

FIG. 14 is an explanatory view of the function and effect of the semiconductor device of the first embodiment. FIG. 14 is a schematic sectional view of the semiconductor device of the first embodiment.

The MOSFET 100 of the first embodiment includes trenches each having a bilaterally asymmetrical shape, in which a side of the first side face 51 of the first trench 50 and a side of the first side face 61 of the second trench 60 are shallow. For this reason, for example, a width of the drift region 26 between the first electric field relaxation region 32*a* and the second trench 60 is wider than the width of the MOSFET 900 of the comparative example. Therefore, the current path during the on-operation of the MOSFET 100 indicated by dotted arrows in FIG. 14 is wider than the current path of the MOSFET 900 of the comparative example, and the on-resistance of the MOSFET 100 is reduced.

To obtain a sufficient electric field relaxation effect for the second insulating layer 16*b* while sufficiently securing the width of the drift region 26 between the first electric field relaxation region 32*a* and the second trench 60 to reduce the on-resistance, it is required to increase the depth of the first electric field relaxation region 32*a*. Generally, to form a deep p-type impurity region in the silicon carbide layer 10 by the ion implantation method, a high energy ion implantation device is required in which an ion accelerating voltage exceeds 1 MeV. However, manufacturing cost of the semiconductor device increases by using the expensive high energy ion implantation device. In addition, in a case where high-energy ion implantation is performed, it is necessary to thicken the mask material for the ion implantation, and it becomes difficult to form a fine pattern. For this reason, there is a possibility that scaling-down of the MOSFET is hindered.

In the method for manufacturing the MOSFET 100 of the first embodiment, the first electric field relaxation region 32*a* is formed by the oblique ion implantation of the p-type impurity into the second side face 52 of the first trench 50. For this reason, the deep first electric field relaxation region 32*a* can be formed without using the high energy ion implantation device. In other words, the deep first electric field relaxation region 32*a* can be formed with the acceleration voltage of less than 1 MeV. Therefore, the MOSFET 100 can be manufactured at low cost. In addition, ion implantation with a thin mask material is possible, and scaling-down of the MOSFET 100 is facilitated.

The angle of the ion implantation direction with respect to the normal direction of the first plane P1 of the silicon carbide layer 10 is preferably 10 degrees or more and 45 degrees or less. Below the aforementioned range, there is a possibility that the width w2 of the first electric field relaxation region 32*a* narrows and the electric field relaxation effect of the second insulating layer 16*b* becomes insufficient. Above the aforementioned range, the deep region of the first trench 50 becomes a shadow, and there is a possibility that the ion implantation of the p-type impurity cannot be performed.

From a viewpoint of widening the current path during the on-operation, the second inclination angle θ2 of the first trench 50 is preferably 0 degrees or more and 30 degrees or less. In addition, from the viewpoint of widening the current path during the on-operation, the width w1 of the second region 51*b* of the first trench 50 is preferably a quarter or more of the maximum distance d between the first side face 51 and the second side face 52, and is more preferably one third or more.

The thickness t1 of the first insulating layer 16*a* between the first gate electrode 18*a* and the bottom face 53 of the first trench 50 is preferably thicker than the thickness t2 of the first insulating layer 16*a* between the first gate electrode 18*a* and the second region 51*b* of the first trench 50. The thickness t1 of the first insulating layer 16*a* between the first gate electrode 18*a* and the bottom face 53 of the first trench 50 is, for example, preferably three times or more of the thickness t2 of the first insulating layer 16*a* between the first gate electrode 18*a* and the second region 51*b* of the first trench 50.

The avalanche breakdown of the pn junction at the off-operation of the MOSFET 100 tends to occur at the bottom of the first electric field relaxation region 32*a*. When the avalanche breakdown occurs, hot holes are injected into the first insulating layer 16*a* on the bottom face 53 of the first trench 50, and there is a possibility that insulating property of the first insulating layer 16*a* is degraded. By thickening the first insulating layer 16*a* on the bottom face 53 of the first trench 50, degradation can be suppressed of the insulating property of the first insulating layer 16*a*. In addition, by thickening the first insulating layer 16*a*, gate capacitance of the first gate electrode 18*a* is reduced, and suppression of power consumption of the MOSFET 100 and high speed operation of the MOSFET 100 can be achieved.

The thickness t4 of the first insulating layer 16*a* between the first gate electrode 18*a* and the first electric field relaxation region 32*a* is preferably thicker than the thickness t3 of the first insulating layer 16*a* between the first gate electrode 18*a* and the first body region 28*a*. By increasing the thickness of the first insulating layer 16*a* between the first electric field relaxation region 32a and the first gate electrode 18a, the gate capacitance of the first gate electrode 18a is reduced, and suppression of power consumption of the MOSFET 100 and high speed operation of the MOSFET 100 can be achieved.

The impurity concentration of the p-type impurity in each of the first electric field relaxation region 32a and the second electric field relaxation region 32b is, for example, preferably $1 \times 10^{18}$ cm$^{-3}$ or more and $1 \times 10^{21}$ cm$^{-3}$ or less. Below the aforementioned range, there is a possibility that the electric field relaxation effect of each of the first insulating layer 16a and the second insulating layer 16b becomes insufficient. Above the aforementioned range, it becomes difficult to form the first electric field relaxation region 32a and the second electric field relaxation region 32b.

The width w2 of the first electric field relaxation region 32a between the second side face 52 and the drift region 26 is preferably 0.2 μm or more and 0.6 μm or less. Below the aforementioned range, there is a possibility that the electric field relaxation effect of the second insulating layer 16b may be insufficient. Above the aforementioned range, there is a possibility that the width of the drift region 26 between the first electric field relaxation region 32a and the second trench 60 narrows, and the on-resistance of the MOSFET 100 cannot be sufficiently reduced. In addition, above the aforementioned range, it is difficult to form the first electric field relaxation region 32a by the ion implantation method.

A case has been mainly described where the inclination angle is 90 degrees between the side face of the first trench 50 and the front plane of the silicon carbide layer 10; however, the inclination angle is not necessarily limited to 90 degrees.

For example, in a case where the second direction is a direction of the a-axis, from a viewpoint of maximizing mobility of electrons, it is preferable that the first side face 51 on which the channel region is formed substantially coincides with the a-face, that is, the (11-20) face. Therefore, for example, when the off angle with respect to the (0001) face of the first plane P1 is α, the inclination angle of the first side face 51 is preferably 90 degrees −α. In this case, the second side face 52 does not coincide with the (11-20) face. Since the channel region is not formed in the second side face 52, a decrease in the mobility of electrons can be neglected. By forming the channel region only on the first side face 51, the mobility of electrons of the MOSFET 100 can be maximized.

In addition, for example, it is preferable that the first trench 50 is formed such that the first direction in which the first trench 50 extends is the a-axis, and the inclination angle of each of the first side face 51 and the second side face 52 is set to 90 degrees. The side face of the trench substantially coincides with the m-face, that is, the (1-100) face, and the mobility of electrons is improved. In this case, both the first side face 51 and the second side face 52 coincide with the (1-100) face.

Figure 15:
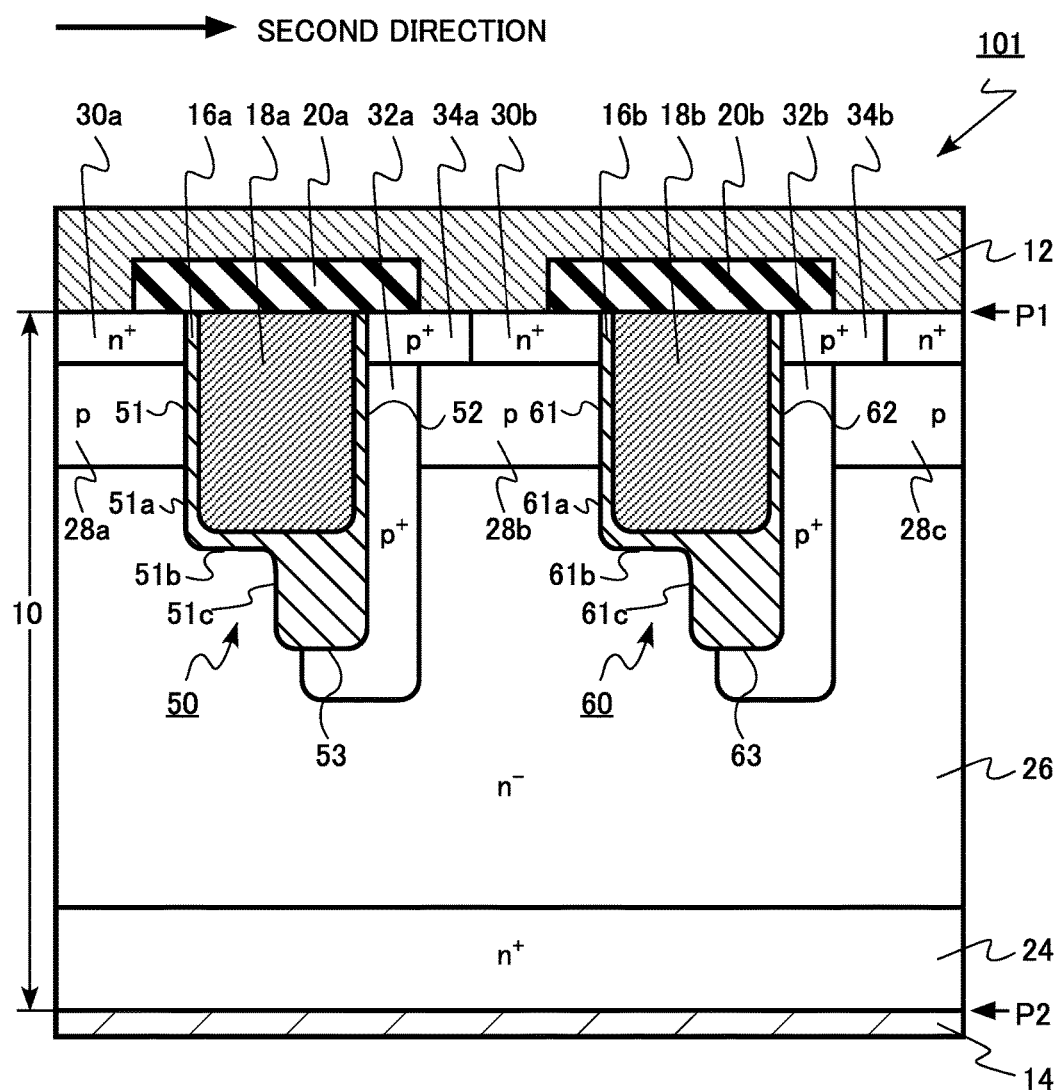
FIG. 15 is a schematic sectional view of a semiconductor device of another example of the first embodiment.

FIG. 15 is a schematic sectional view of a semiconductor device of another example of the first embodiment. The semiconductor device of the other example of the first embodiment is a trench gate type vertical MOSFET 101 using silicon carbide.

In the MOSFET 101, the second region 51b of the first trench 50 and the second region 61b of the second trench 60 are substantially parallel to the first plane P1. In other words, the second inclination angle is 0 degrees. The MOSFET 101 also has the effect similar to that of the MOSFET 100.

As described above, according to the MOSFET 100 of the first embodiment and the MOSFET 101 of the modified example, the on-resistance is reduced. In addition, a breakdown voltage of the insulating layer is improved, and the reliability is improved. In addition, according to the manufacturing method of the first embodiment, reduction of the manufacturing cost of the MOSFET 100 and scaling-down of the MOSFET 100 are possible.

Second Embodiment

A semiconductor device of a second embodiment is different from the semiconductor device of the first embodiment in that at least a part of the first electrode is located between the gate electrode and the second side face, and at least a part of the first electrode is in contact with the fifth silicon carbide region and the sixth silicon carbide region. Hereinafter, a part of the description overlapping with the first embodiment will be omitted.

Figure 16:
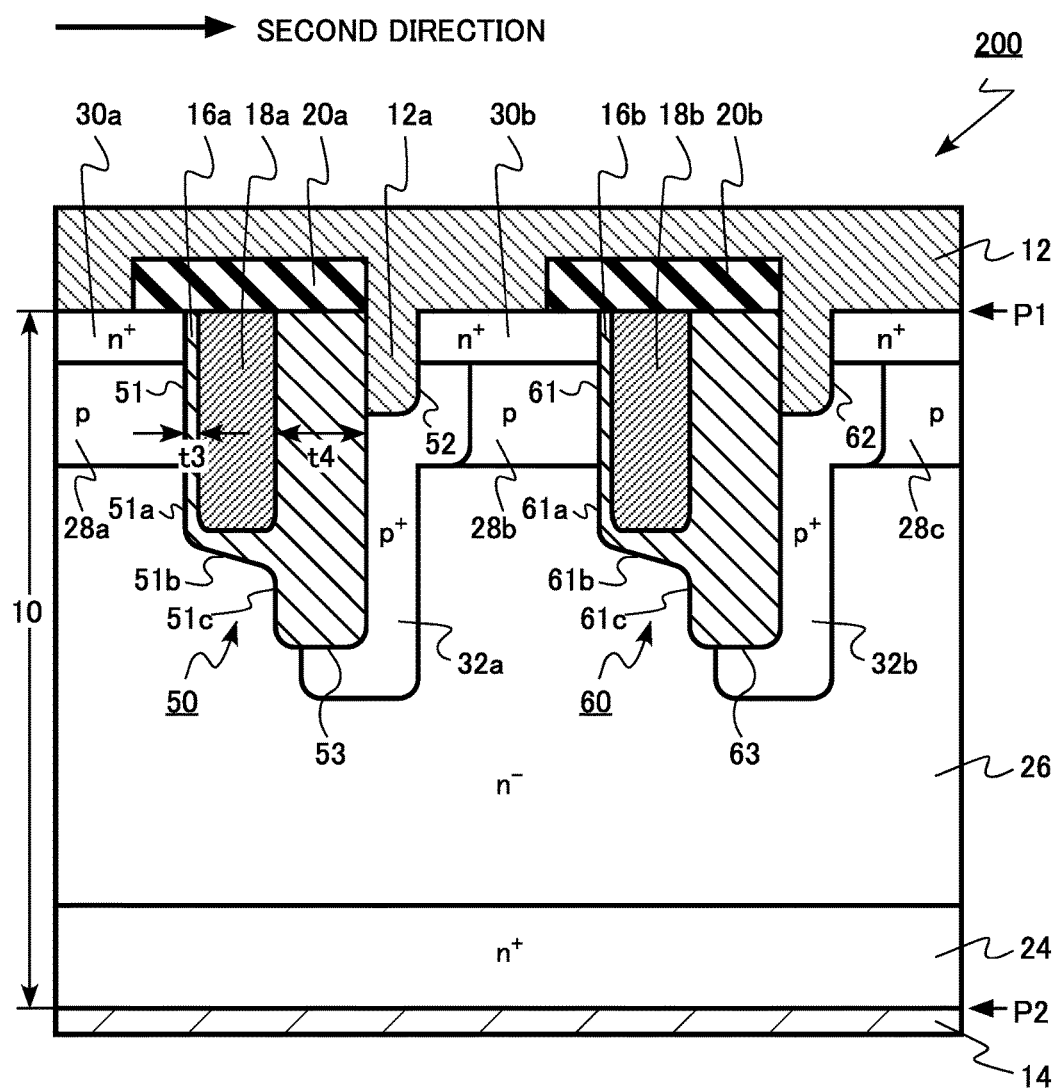
FIG. 16 is a schematic sectional view of a semiconductor device of a second embodiment.

FIG. 16 is a schematic sectional view of the semiconductor device of the second embodiment. The semiconductor device of the second embodiment is a trench gate type vertical MOSFET 200 using silicon carbide. The MOSFET 200 is an n-channel MOSFET using electrons as carriers.

The MOSFET 200 includes a silicon carbide layer 10, a source electrode 12 (first electrode), a drain electrode (second electrode), a first insulating layer 16a (insulating layer), a second insulating layer 16b, a first gate electrode 18a, a second gate electrode 18b, a first interlayer insulating layer 20a, a second interlayer insulating layer 20b, a first trench 50 (trench), and a second trench 60.

In the silicon carbide layer 10, there is provided an n$^+$-type drain region 24, an n$^-$-type drift region 26 (first silicon carbide region), a p-type first body region 28a (second silicon carbide region), a p-type second body region 28b (third silicon carbide region), a p-type third body region 28c, an n$^+$-type first source region 30a (fourth silicon carbide region), an n$^+$-type second source region 30b (fifth silicon carbide region), a p$^+$-type first electric field relaxation region 32a (sixth silicon carbide region), a p$^+$-type second electric field relaxation region 32b, a p$^+$-type first contact region 34a, and a p$^+$-type second contact region 34b.

The first trench 50 and the second trench 60 exist in the silicon carbide layer 10. The first trench 50 and the second trench 60 extend in the first direction. The first trench 50 and the second trench 60 each are a part of the silicon carbide layer 10.

The first trench 50 includes the first side face 51, the second side face 52, and the bottom face 53. The bottom face 53 is located between the first side face 51 and the second side face 52. The second trench 60 includes the first side face 61, the second side face 62, and the bottom face 63. The bottom face 63 is located between the first side face 61 and the second side face 62.

A part 12a of the source electrode 12 is provided in the silicon carbide layer 10. The part 12a of the source electrode 12 is located between the first gate electrode 18a and the second side face 52. The part 12a of the source electrode 12 is in contact with the second source region 30b and the first electric field relaxation region 32a on the second side face 52. The part 12a of the source electrode 12 is in contact with the first insulating layer 16a.

A depth of the part 12a of the source electrode 12 is shallower than, for example, a depth of the second body region 28b.

A thickness ("t4" in FIG. 16) of the first insulating layer 16a between the first gate electrode 18a and the part 12a of the source electrode 12 is thicker than, for example, a thickness ("t3" in FIG. 16) of the first insulating layer 16a between the first gate electrode 18a and the first body region 28a. The thickness t4 of the first insulating layer 16a between the first gate electrode 18a and the part 12a of the source electrode 12 is, for example, five times or more of the thickness t3 of the first insulating layer 16a between the first gate electrode 18a and the first body region 28a.

Next, an example will be described of a method for manufacturing the semiconductor device of the second embodiment.

FIGS. 17 to 25 are schematic sectional views illustrating the example of the method for manufacturing the semiconductor device of the second embodiment.

Figure 17:
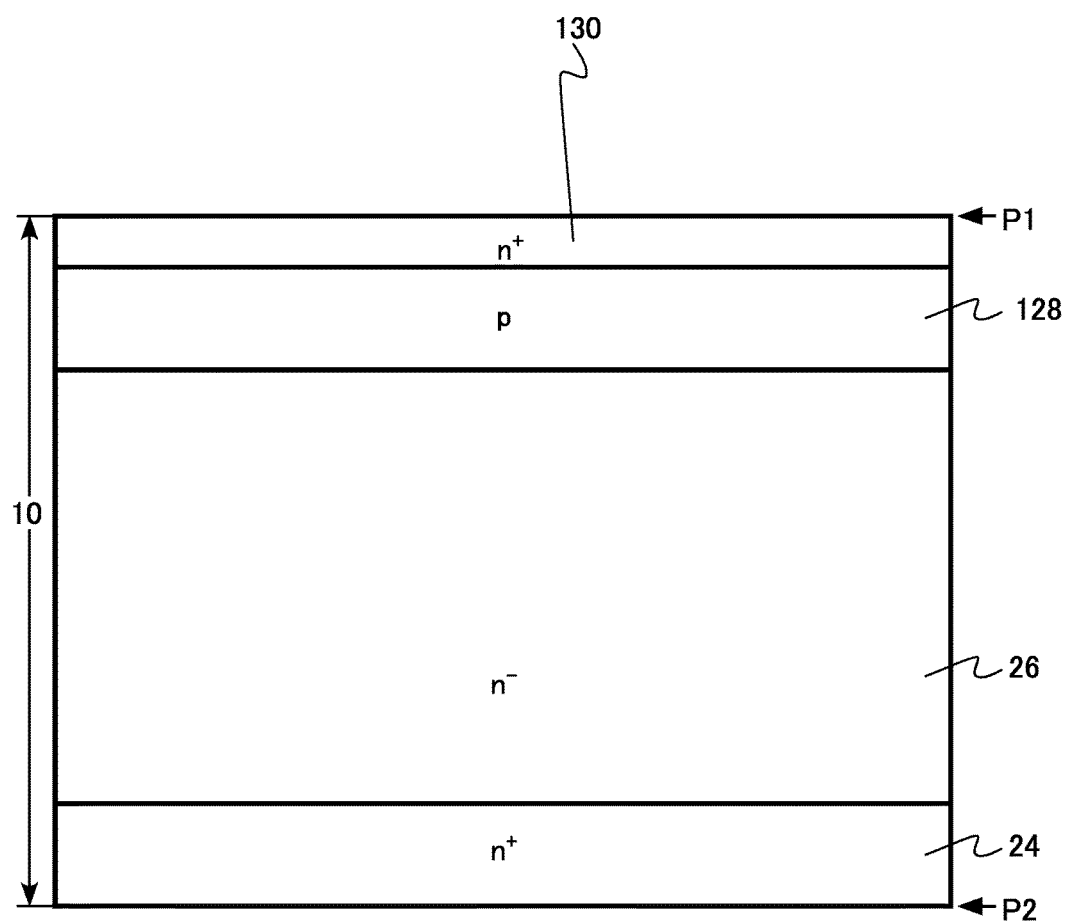
FIG. 17 is a schematic sectional view illustrating an example of a method for manufacturing the semiconductor device of the second embodiment.

First, the silicon carbide layer 10 is prepared including a first plane P1 and a second plane P2 and including the $n^+$-type drain region 24 and the $n^-$-type drift region 26 (first silicon carbide region). Next, a p-type second silicon carbide portion 128 and an $n^+$-type third silicon carbide portion 130 are formed in the silicon carbide layer 10 (FIG. 17). The third silicon carbide portion 130 is located between the second silicon carbide portion 128 and the first plane P1.

The second silicon carbide portion 128 and the third silicon carbide portion 130 are formed by the ion implantation method, for example. The second silicon carbide portion 128 finally becomes the first body region 28a, the second body region 28b, and the third body region 28c. The third silicon carbide portion 130 finally becomes the first source region 30a and the second source region 30b.

Next, a first mask material 70 is formed on the front plane of the silicon carbide layer 10. The first mask material 70 is formed by, for example, deposition by the CVD method and patterning by the lithography method and the RIE method. The first mask material 70 is, for example, a silicon nitride film.

Figure 18:
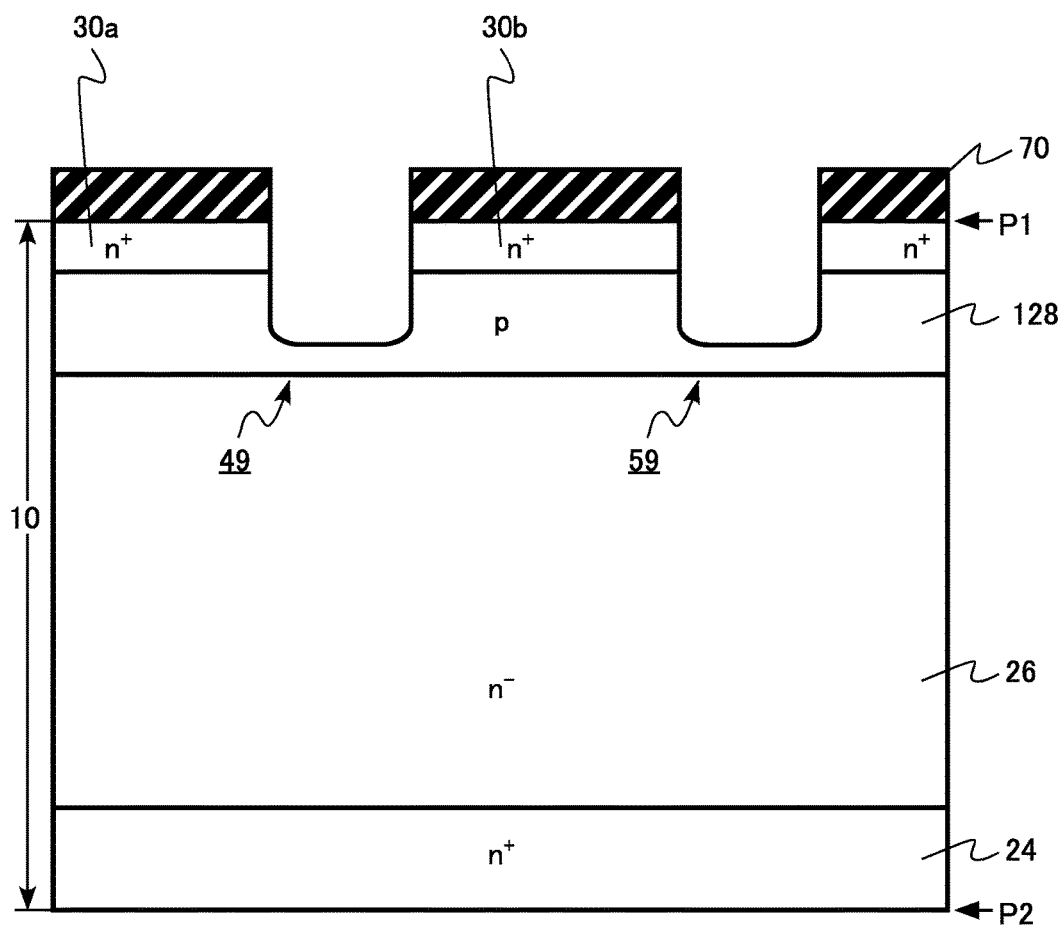
FIG. 18 is a schematic sectional view illustrating the example of the method for manufacturing the semiconductor device of the second embodiment.

Next, using the first mask material 70 as a mask, a first preliminary trench 49 and a second preliminary trench 59 are formed by the RIE method (FIG. 18). A depth of each of the first preliminary trench 49 and the second preliminary trench 59 is shallower than, for example, a depth of the second silicon carbide portion 128.

Figure 19:
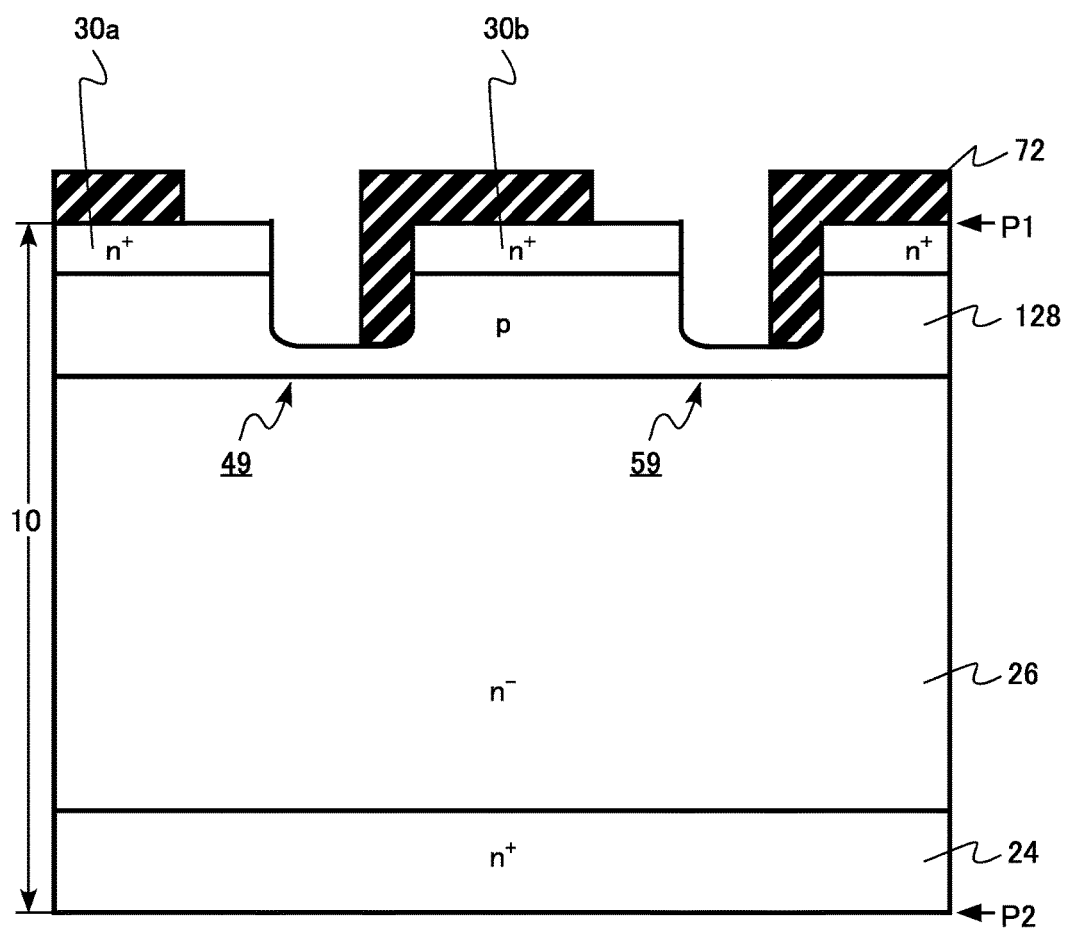
FIG. 19 is a schematic sectional view illustrating the example of the method for manufacturing the semiconductor device of the second embodiment.

Next, after removing the first mask material 70, a second mask material 72 is formed on a part of the front plane of the silicon carbide layer 10, a part in the first preliminary trench 49, and a part of the second preliminary trench 59 (FIG. 19). The second mask material 72 is formed by, for example, deposition by the CVD method and patterning by the lithography method and the RIE method. The second mask material 72 is, for example, a silicon nitride film.

Figure 20:
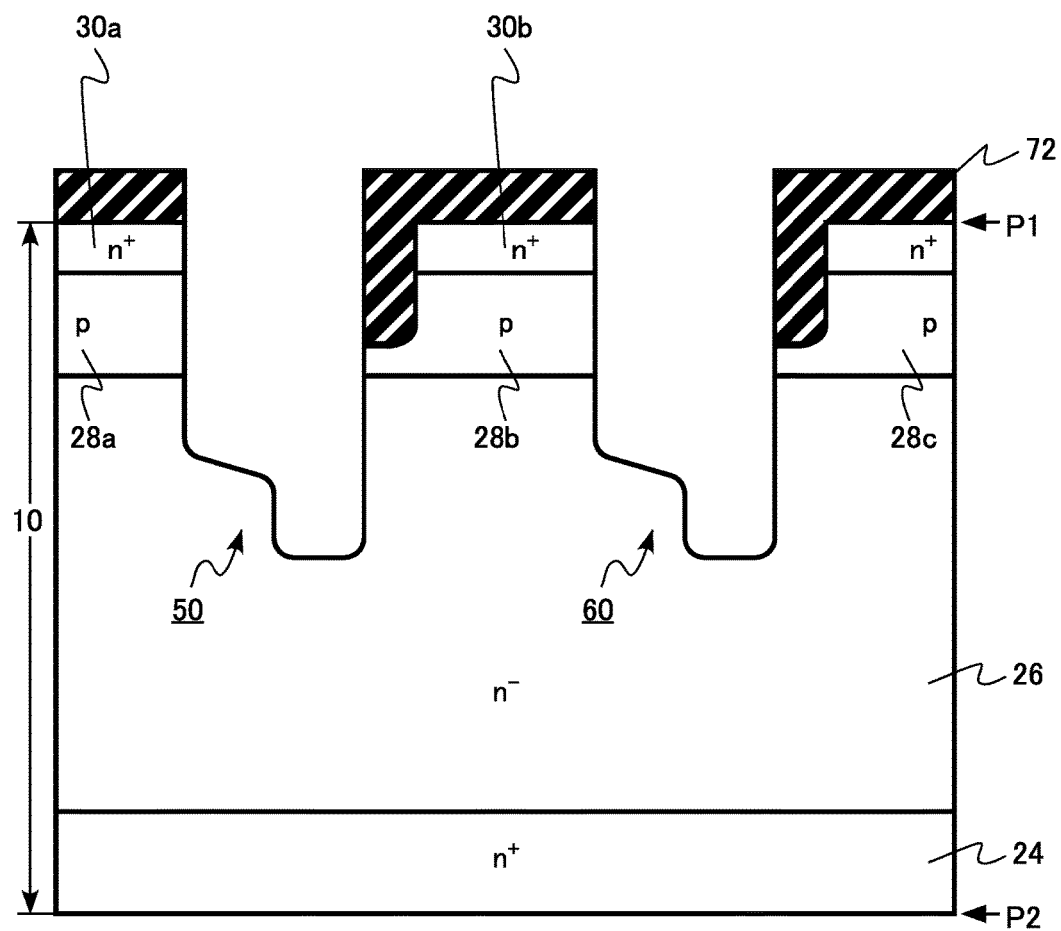
FIG. 20 is a schematic sectional view illustrating the example of the method for manufacturing the semiconductor device of the second embodiment.

Next, using the second mask material 72 as a mask, the first trench 50 and the second trench 60 are formed by the RIE method (FIG. 20). A depth of a portion corresponding to each of the first preliminary trench 49 and the second preliminary trench 59 is deeper than depths of other portions.

Figure 21:
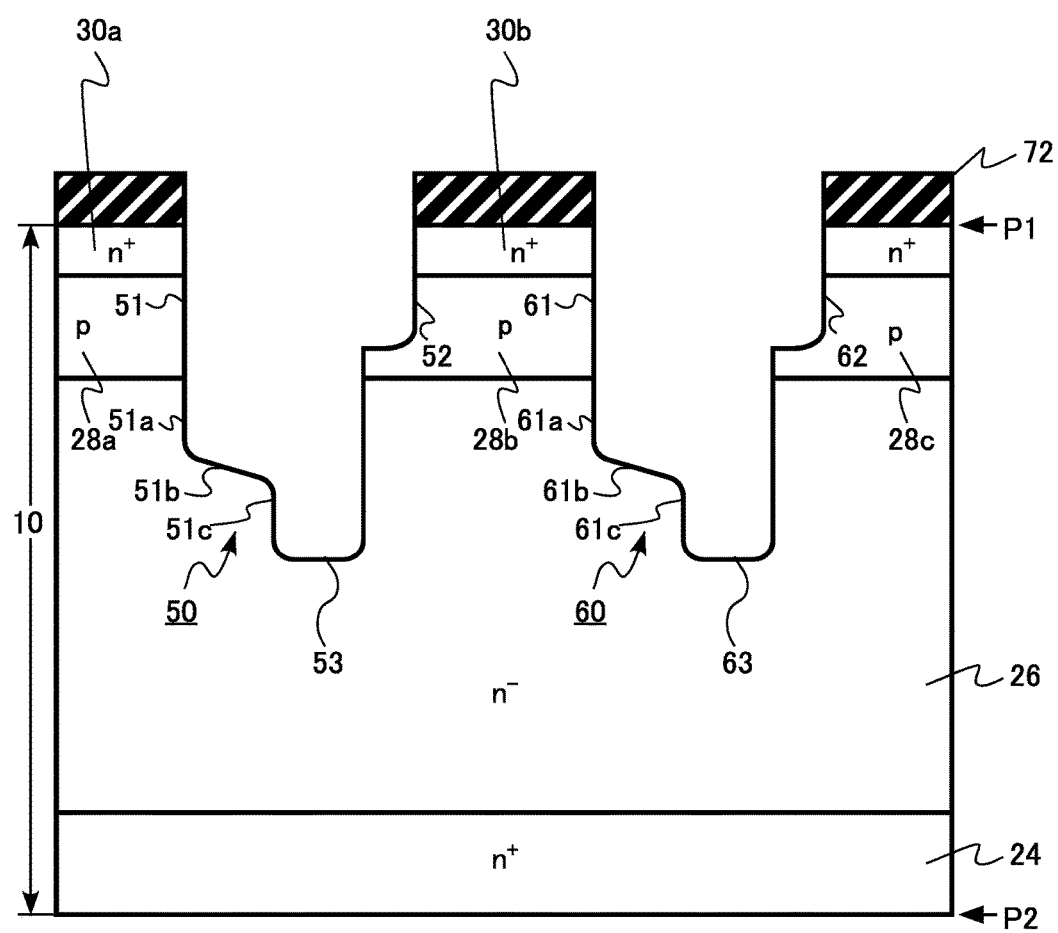
FIG. 21 is a schematic sectional view illustrating the example of the method for manufacturing the semiconductor device of the second embodiment.

Next, the second mask material 72 in the first trench 50 and the second mask material 72 in the second trench 60 are removed (FIG. 21).

The first trench 50 includes the first side face 51, the second side face 52, and the bottom face 53. The bottom face 53 is located between the first side face 51 and the second side face 52. A portion of the first side face 51 being in contact with the drift region 26 includes a first region 51a having a first inclination angle with respect to the first plane P1, a second region 51b having a second inclination angle with respect to the first plane P1, and a third region 51c having a third inclination angle with respect to the first plane P1. The second inclination angle is smaller than the first inclination angle. The third inclination angle is larger than the second inclination angle.

The second trench 60 includes the first side face 61, the second side face 62, and the bottom face 63. The bottom face 63 is located between the first side face 61 and the second side face 62. The portion of the first side face 61 being in contact with the drift region 26 includes the first region 61a having the first inclination angle with respect to the first plane P1, the second region 61b having the second inclination angle with respect to the first plane P1, and the third region 61c having the third inclination angle with respect to the first plane P1. The second inclination angle is smaller than the first inclination angle. The third inclination angle is larger than the second inclination angle θ2. The second trench 60 has a configuration similar to that of the first trench 50.

In the first trench 50 and the second trench 60, the first inclination angle is, for example, 80 degrees or more and 90 degrees or less. The second inclination angle is, for example, 0 degrees or more and 30 degrees or less. The third inclination angle is, for example, 80 degrees or more and 90 degrees or less.

Figure 22:
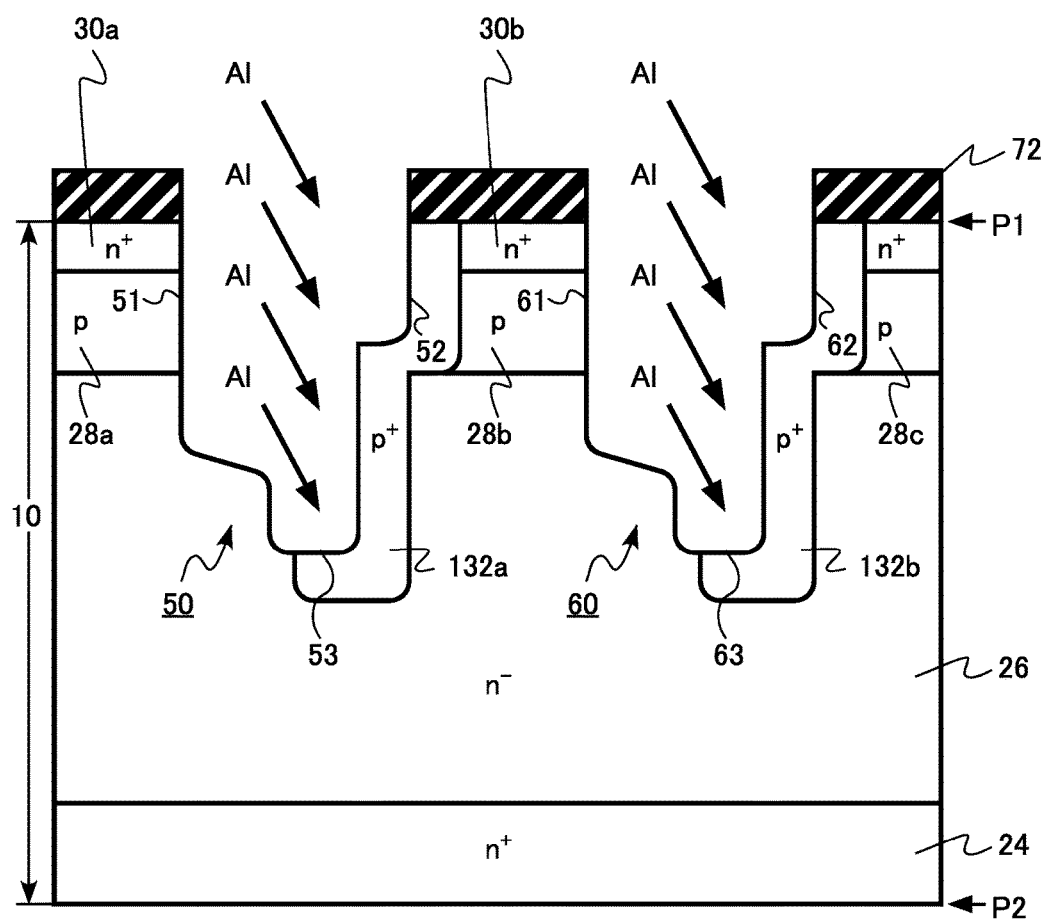
FIG. 22 is a schematic sectional view illustrating the example of the method for manufacturing the semiconductor device of the second embodiment.

Next, in the silicon carbide layer 10, a p-type fourth silicon carbide portion 132a being in contact with the second side face 52 and the bottom face 53 of the first trench 50 and having a p-type impurity concentration higher than a p-type impurity concentration of the second silicon carbide portion 128, is formed by oblique ion implantation of the p-type impurity (FIG. 22).

The fourth silicon carbide portion 132a is formed by the oblique ion implantation of the p-type impurity into the second side face 52 of the first trench 50. The p-type impurity is, for example, aluminum (Al).

An acceleration voltage of the oblique ion implantation is, for example, less than 1 MeV. An angle of an ion implantation direction with respect to a normal direction of the first plane P1 of the silicon carbide layer 10 is, for example, 10 degrees or more and 45 degrees or less.

During formation of the fourth silicon carbide portion 132a, at the same time, a p-type sixth silicon carbide portion 132b is also formed being in contact with the second side face 62 and the bottom face 63 of the second trench 60 and having a p-type impurity concentration higher than the p-type impurity concentration of the second silicon carbide portion 128. The fourth silicon carbide portion 132a and the sixth silicon carbide portion 132b become the first electric field relaxation region 32a and the second electric field relaxation region 32b, respectively.

A width of the fourth silicon carbide portion 132a between the second side face 52 of the first trench 50 and the drift region 26 is, for example, 0.6 μm or less. A width of the sixth silicon carbide portion 132b between the second side face 62 of the second trench 60 and the drift region 26 is, for example, 0.6 μm or less. The p-type impurity concentration of each of the fourth silicon carbide portion 132a and the sixth silicon carbide portion 132b is, for example, $1\times10^{18}$ cm$^{-3}$ or more and $1\times10^{21}$ cm$^{-3}$ or less.

Figure 23:
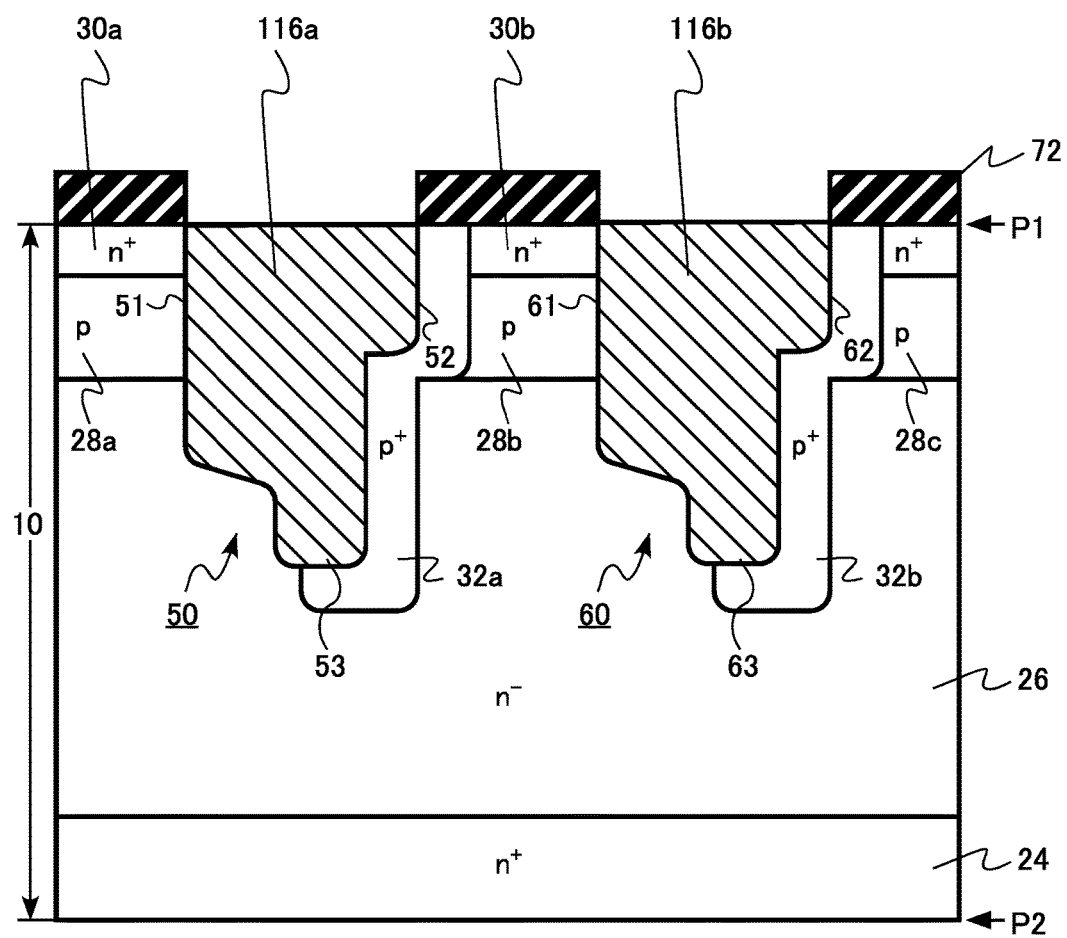
FIG. 23 is a schematic sectional view illustrating the example of the method for manufacturing the semiconductor device of the second embodiment.

Next, the inside of the first trench 50 is filled with an insulating layer 116a, and the inside of the second trench 60 is filled with an insulating layer 116b (FIG. 23). The insulating layer 116a and the insulating layer 116b are, for example, silicon oxide films formed by the CVD method.

Next, a part of the insulating layer 116a in the first trench 50 is removed, and a part of the insulating layer 116b in the second trench 60 is removed. Removal of the part of the insulating layer 116a and the part of the insulating layer 116b is performed by, for example, a wet etching method.

Figure 24:
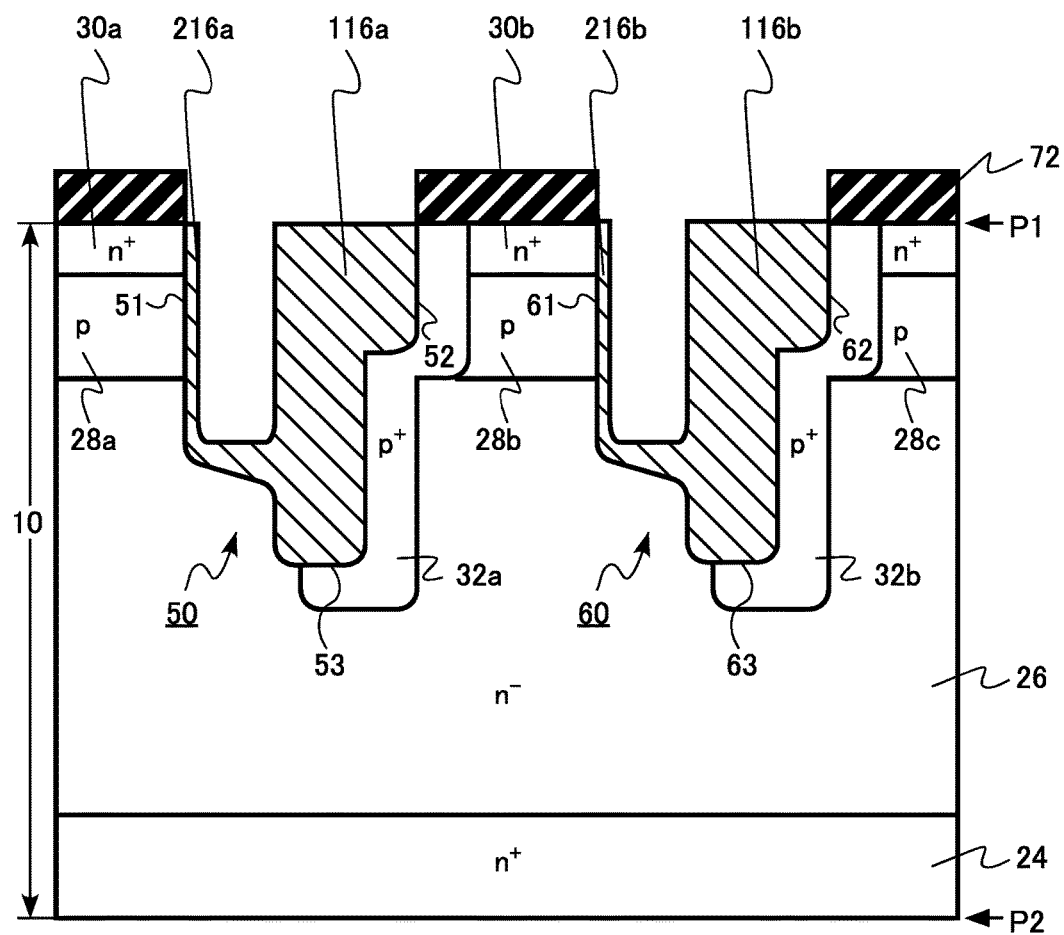
FIG. 24 is a schematic sectional view illustrating the example of the method for manufacturing the semiconductor device of the second embodiment.

Next, an insulating layer 216a is formed on the first side face 51 of the first trench 50. At the same time, an insulating layer 216b is formed on the first side face 61 of the second trench 60 (FIG. 24). The insulating layer 216a and the insulating layer 216b are, for example, silicon oxide films formed by the thermal oxidation method or the CVD method.

The insulating layer 116a and the insulating layer 216a configure the first insulating layer 16a formed inside the first trench 50. The insulating layer 116b and the insulating layer 216b configure the second insulating layer 16b formed inside the second trench 60.

Next, the first gate electrode 18a is formed on the first insulating layer 16a. At the same time, the second gate electrode 18b is formed on the second insulating layer 16b. The first gate electrode 18a and the second gate electrode 18b are, for example, polycrystalline silicon formed by the CVD method.

Figure 25:
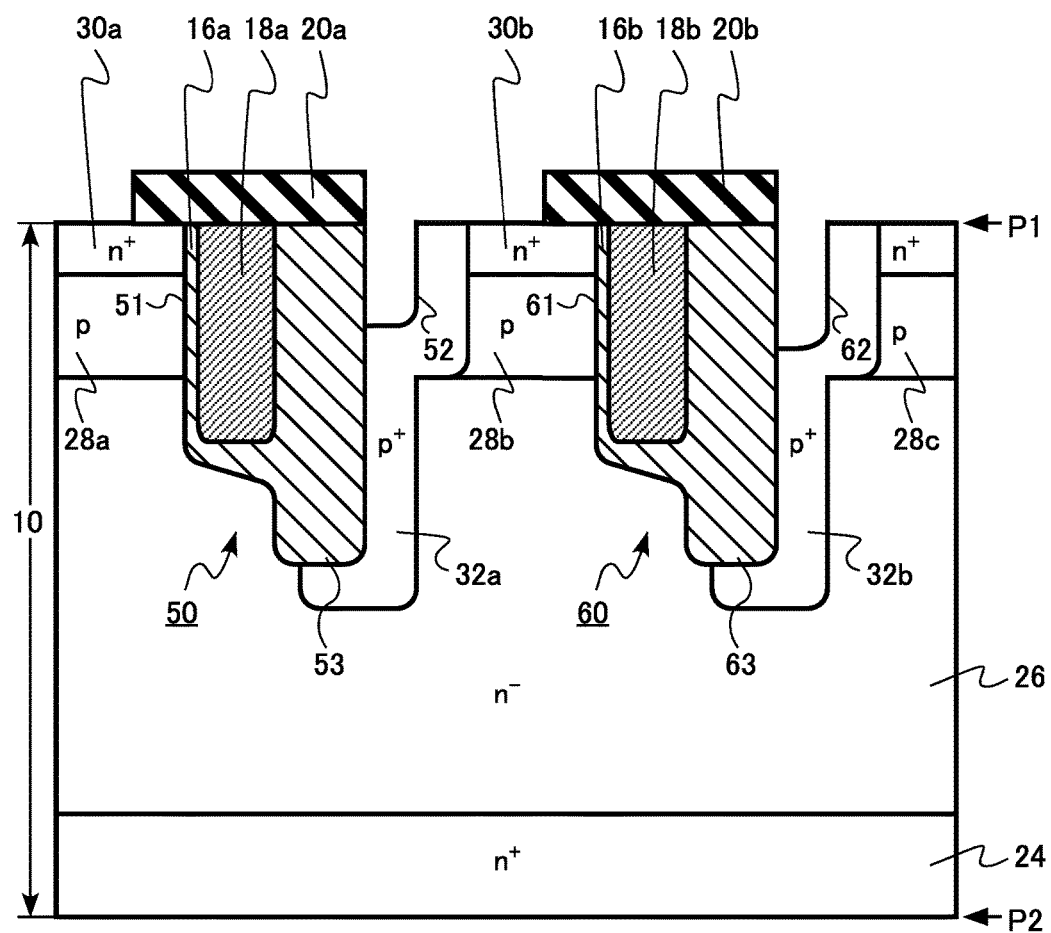
FIG. 25 is a schematic sectional view illustrating the example of the method for manufacturing the semiconductor device of the second embodiment.

Next, the second mask material 72 is removed. Next, the first interlayer insulating layer 20a is formed on the first gate electrode 18a. At the same time, the second interlayer insulating layer 20b is formed on the second gate electrode 18b (FIG. 25). The first interlayer insulating layer 20a and the second interlayer insulating layer 20b are, for example, silicon oxide films formed by the CVD method.

Afterward, the source electrode 12 and the drain electrode 14 are formed using a known process technique. By the above manufacturing method, the MOSFET 200 illustrated in FIG. 16 is manufactured.

In the MOSFET 200, by a function and effect similar to those of the MOSFET 100 of the first embodiment, on-resistance is reduced and a breakdown voltage of the insulating layer is improved. Further, the source electrode 12 and the part 12a of the source electrode 12 are in contact with the second source region 30b and the first electric field relaxation region 32a on the second side face 52. As a result, a contact area between the source electrode 12 and the second source region 30b increases, and contact resistance is reduced. In addition, a contact area between the source electrode 12 and the first electric field relaxation region 32a increases, and contact resistance is reduced. Therefore, the on-resistance of the MOSFET 200 is further reduced. In addition, the source electrode 12 and the part 12a of the source electrode 12 are in contact with the second source region 30b and the first electric field relaxation region 32a on the second side face 52, whereby a pitch of unit cells (cell size in the second direction) can also be reduced.

From a viewpoint of improving insulating property between the first gate electrode 18a and the part 12a of the source electrode 12, the thickness t4 of the first insulating layer 16a between the first gate electrode 18a and the part 12a of the source electrode 12 is preferably thicker than the thickness t3 of the first insulating layer 16a between the first gate electrode 18a and the first body region 28a. From the viewpoint of improving insulating property between the first gate electrode 18a and the part 12a of the source electrode 12, the thickness t4 of the first insulating layer 16a between the first gate electrode 18a and the part 12a of the source electrode 12 is preferably five times or more of the thickness t3 of the first insulating layer 16a between the first gate electrode 18a and the first body region 28a. In addition, the thickness t4 of the first insulating layer 16a between the first gate electrode 18a and the part 12a of the source electrode 12 is made thicker than the thickness t3 of the first insulating layer 16a between the first gate electrode 18a and the first body region 28a, whereby gate capacitance of the first gate electrode 18a is reduced, and suppression of power consumption of the MOSFET 200 and high speed operation of the MOSFET 200 can be achieved.

As described above, according to the second embodiment, the on-resistance of the MOSFET 200 is reduced. In particular, the on-resistance is reduced due to contact reduction of the source electrode 12. In addition, the breakdown voltage of the insulating layer is improved, and reliability is improved. In addition, according to the second embodiment, scaling-down of the MOSFET 200 is possible. In particular, scaling-down is possible by reduction of the pitch of unit cells.

Third Embodiment

An inverter circuit and a driving device of a third embodiment is a driving device including the semiconductor device of the first embodiment.

Figure 26:
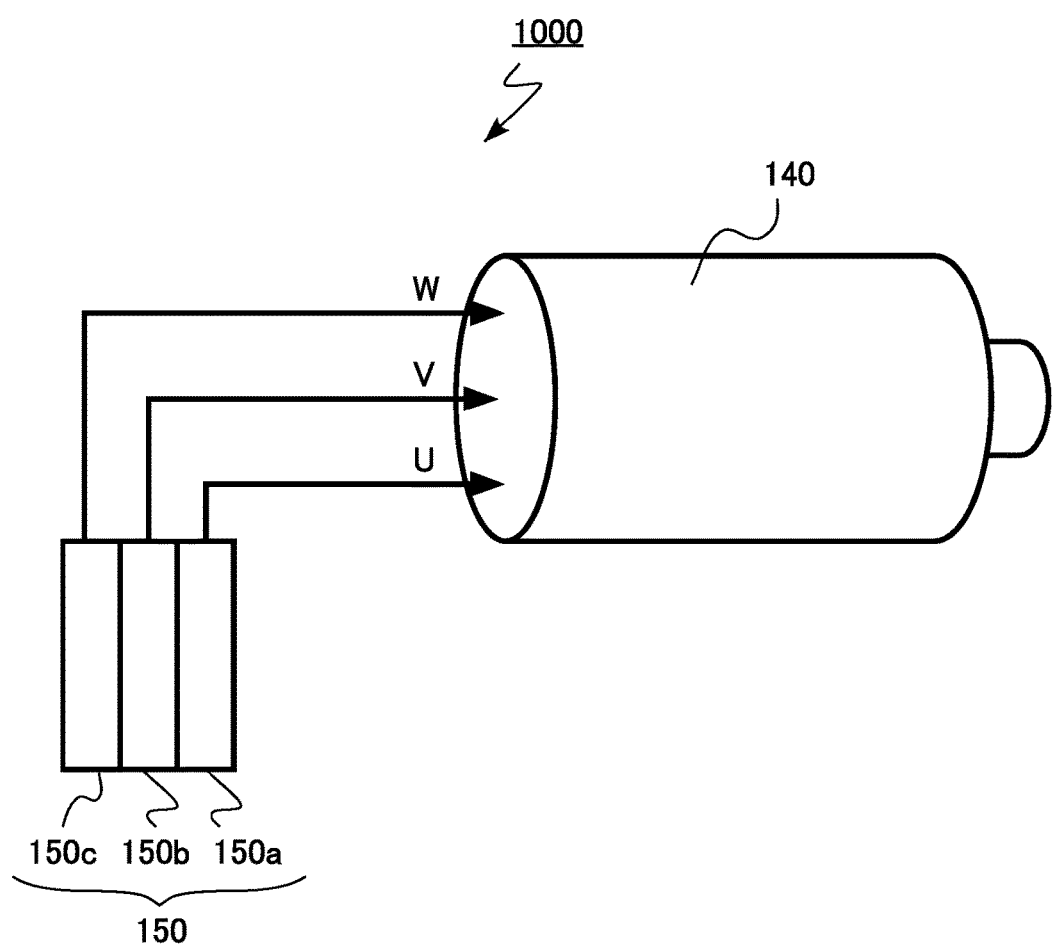
FIG. 26 is a schematic view of a driving device of a third embodiment.

FIG. 26 is a schematic view of the driving device of the third embodiment. A driving device 1000 includes a motor 140 and an inverter circuit 150.

The inverter circuit 150 includes three semiconductor modules 150a, 150b, and 150c each using the MOSFET 100 of the first embodiment as a switching element. By connecting the three semiconductor modules 150a, 150b, and 150c together in parallel, the three-phase inverter circuit 150 is achieved including three AC voltage output terminals U, V, and W. The motor 140 is driven by the AC voltage output from the inverter circuit 150.

According to the third embodiment, by including the MOSFET 100 with improved characteristics, characteristics of the inverter circuit 150 and the driving device 1000 are improved.

Fourth Embodiment

A vehicle of a fourth embodiment is a vehicle including the semiconductor device of the first embodiment.

Figure 27:
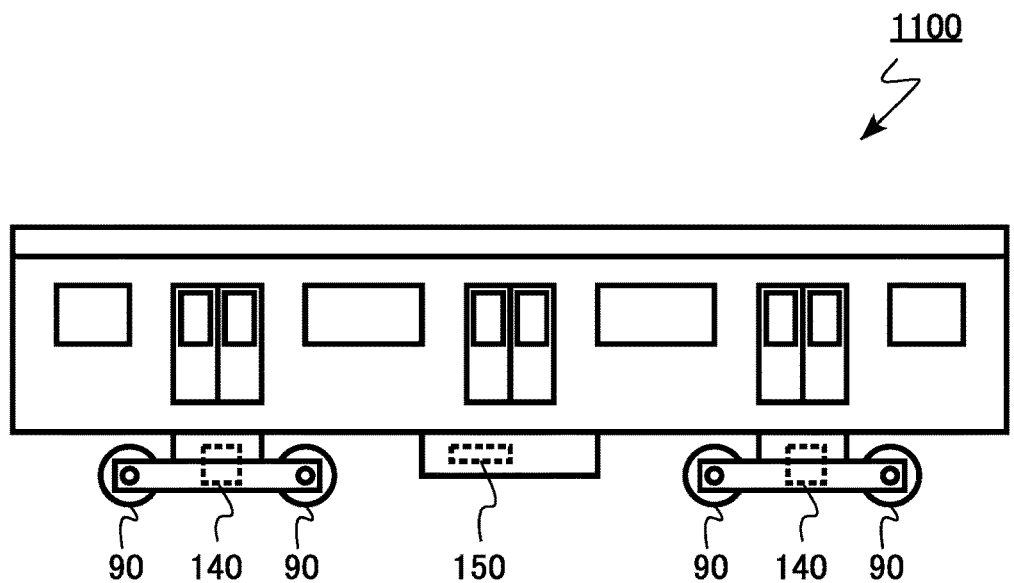
FIG. 27 is a schematic view of a vehicle of a fourth embodiment.

FIG. 27 is a schematic view of the vehicle of the fourth embodiment. A vehicle 1100 of the fourth embodiment is a railroad vehicle. The vehicle 1100 includes motors 140 and an inverter circuit 150.

The inverter circuit 150 includes three semiconductor modules each using the MOSFET 100 of the first embodiment as a switching element. By connecting three semiconductor modules together in parallel, the three-phase inverter circuit 150 is achieved including three AC voltage output terminals U, V, and W. The motors 140 are driven by the AC voltage output from the inverter circuit 150. Wheels 90 of the vehicle 1100 are rotated by the motors 140.

According to the fourth embodiment, by including the MOSFET 100 with improved characteristics, characteristics of the vehicle 1100 are improved.

Fifth Embodiment

A vehicle of a fifth embodiment is a vehicle including the semiconductor device of the first embodiment.

Figure 28:
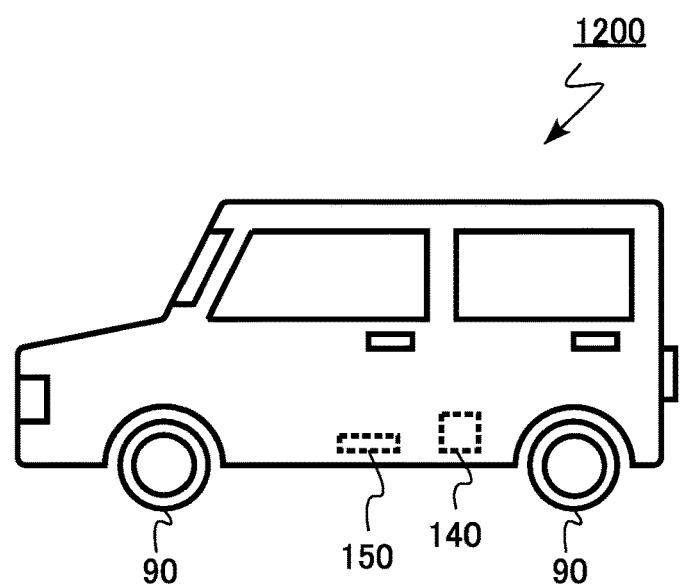
FIG. 28 is a schematic view of a vehicle of a fifth embodiment.

FIG. 28 is a schematic view of the vehicle of the fifth embodiment. A vehicle 1200 of the fifth embodiment is an automobile. The vehicle 1200 includes a motor 140 and an inverter circuit 150.

The inverter circuit 150 includes three semiconductor modules each using the MOSFET 100 of the first embodiment as a switching element. By connecting three semiconductor modules together in parallel, the three-phase inverter circuit 150 is achieved including three AC voltage output terminals U, V, and W.

The motors 140 are driven by the AC voltage output from the inverter circuit 150. Wheels 90 of the vehicle 1200 are rotated by the motor 140.

According to the fifth embodiment, by including the MOSFET 100 with improved characteristics, characteristics of the vehicle 1200 are improved.

Sixth Embodiment

An elevator of a sixth embodiment is an elevator including the semiconductor device of the first embodiment.

Figure 29:
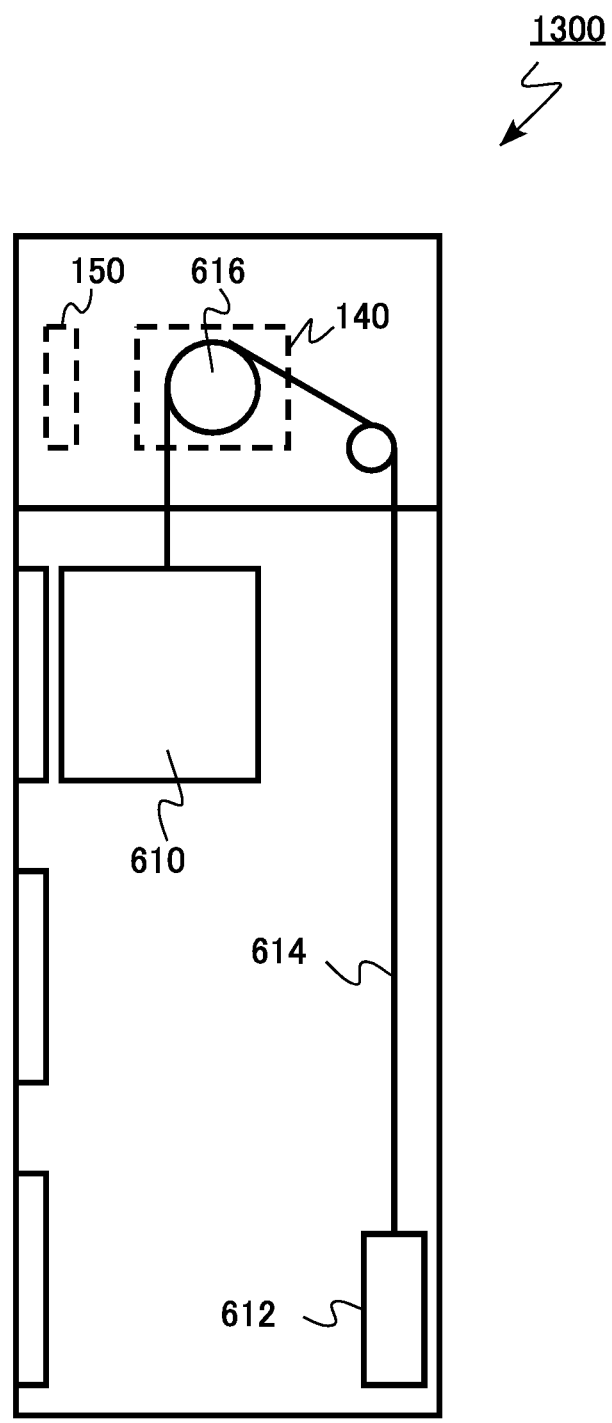
FIG. 29 is a schematic view of an elevator of a sixth embodiment.

FIG. 29 is a schematic view of the elevator of the sixth embodiment. An elevator 1300 of the sixth embodiment includes a car 610, a counterweight 612, a wire rope 614, a hoisting machine 616, a motor 140, and an inverter circuit 150.

The inverter circuit 150 includes three semiconductor modules each using the MOSFET 100 of the first embodiment as a switching element. By connecting three semiconductor modules together in parallel, the three-phase inverter circuit 150 is achieved including three AC voltage output terminals U, V, and W.

The motors 140 are driven by the AC voltage output from the inverter circuit 150. The hoisting machine 616 is rotated by the motor 140, and the car 610 moves up and down.

According to the sixth embodiment, by including the MOSFET 100 with improved characteristics, characteristic of the elevator 1300 are improved.

As described above, in each of the first and second embodiments, an example case has been described of 4H—SiC as a crystal structure of silicon carbide; however, the present disclosure can be applied to silicon carbide of another crystal structure such as 6H—SiC, 3C—SiC, or the like.

In each of the first and second embodiments, the MOSFET has been described as an example of the semiconductor device; however, the present disclosure can also be applied to an Insulated Gate Bipolar Transistor (IGBT). The IGBT can be achieved by replacing a region corresponding to the drain region 24 of the MOSFET from the n-type to the p-type.

In each of the first and second embodiments, an example case has been described where the first-conductivity type is the n-type and the second-conductivity type is the p-type; however, a case is also possible where the first-conductivity type is the p-type and the second-conductivity type is the n-type. In that case, the MOSFET is a p-channel MOSFET using holes as carriers.

In addition, in each of the third to sixth embodiments, an example case has been described of including the semiconductor device of the first embodiment; however, the semiconductor device of the second embodiment can also be applied.

In addition, in each of the third to sixth embodiments, an example case has been described where the semiconductor device of the present disclosure is applied to the vehicle or the elevator; however, the semiconductor device of the present disclosure can also be applied to, for example, a power conditioner of a photovoltaic power generation system.

While certain embodiments have been described, these embodiments have been presented by way of example only, and are not intended to limit the scope of the inventions. Indeed, the semiconductor device, the method for manufacturing the semiconductor device, the inverter circuit, the driving device, the vehicle, and the elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a silicon carbide layer including a first plane and a second plane;
a first electrode located on the first plane;
a second electrode located on the second plane;
a trench existing in the silicon carbide layer and including a first side face, a second side face, and a bottom face between the first side face and the second side face;
a first silicon carbide region of a first-conductivity type located in the silicon carbide layer and being in contact with the first side face;
a second silicon carbide region of a second-conductivity type located in the silicon carbide layer, the second silicon carbide region located between the first silicon carbide region and the first plane, and the second silicon carbide region being in contact with the first side face;
a third silicon carbide region of the second-conductivity type located in the silicon carbide layer, the third silicon carbide region located between the first silicon carbide region and the first plane, and the trench being interposed between the third silicon carbide region and the second silicon carbide region;
a fourth silicon carbide region of the first-conductivity type located in the silicon carbide layer, the fourth silicon carbide region located between the second silicon carbide region and the first plane, and the fourth silicon carbide region being in contact with the first side face;
a fifth silicon carbide region of the first-conductivity type located in the silicon carbide layer, the fifth silicon carbide region located between the third silicon carbide region and the first plane, and the trench being interposed between the fifth silicon carbide region and the fourth silicon carbide region;
a sixth silicon carbide region of the second-conductivity type located in the silicon carbide layer, the sixth silicon carbide region being in contact with the second side face and the bottom face, and the sixth silicon carbide region having a second-conductivity type impurity concentration higher than a second-conductivity type impurity concentration in the third silicon carbide region;
a gate electrode located between the first side face and the second side face; and
an insulating layer located between the gate electrode and the first silicon carbide region, the gate electrode and the second silicon carbide region, the gate electrode and the third silicon carbide region, and the gate electrode and the sixth silicon carbide region, wherein
a portion of the first side face being in contact with the first silicon carbide region includes a first region having a first inclination angle with respect to the first plane, a second region being closer to the second plane than the first region and having a second inclination angle smaller than the first inclination angle with respect to the first plane, and a third region being closer to the second plane than the second region and having a third inclination angle larger than the second inclination angle with respect to the first plane.

2. The semiconductor device according to claim 1, wherein a thickness of the insulating layer between the gate electrode and the bottom face is thicker than a thickness of the insulating layer between the gate electrode and the second region.

3. The semiconductor device according to claim 1, wherein a thickness of the insulating layer between the gate electrode and the bottom face is three times or more of a thickness of the insulating layer between the gate electrode and the second region.

4. The semiconductor device according to claim 1, wherein the second inclination angle is 0 degrees or more and 30 degrees or less.

5. The semiconductor device according to claim 1, wherein a width of the second region is a quarter or more of a maximum distance between the first side face and the second side face.

6. The semiconductor device according to claim 1, wherein a width of the sixth silicon carbide region between the second side face and the first silicon carbide region is 0.6 μm or less.

7. The semiconductor device according to claim 1, wherein the second-conductivity type impurity concentration in the sixth silicon carbide region is $1\times10^{18}$ cm$^{-3}$ or more and $1\times10^{21}$ cm$^{-3}$ or less.

8. The semiconductor device according to claim 1, wherein a thickness of the insulating layer between the gate electrode and the sixth silicon carbide region is thicker than a thickness of the insulating layer between the gate electrode and the second silicon carbide region.

9. The semiconductor device according to claim 1, wherein at least a part of the first electrode is located between the gate electrode and the second side face, and the at least a part of the first electrode is in contact with the fifth silicon carbide region and the sixth silicon carbide region.

10. An inverter circuit comprising a semiconductor device according to claim 1.

11. A driving device comprising a semiconductor device according to claim 1.

12. A vehicle comprising a semiconductor device according to claim 1.

13. An elevator comprising a semiconductor device according to claim 1.

14. A method for manufacturing a semiconductor device comprising:

forming, in a silicon carbide layer including a first plane and a second plane and including a first silicon carbide region of a first-conductivity type, a second silicon carbide portion of a second-conductivity type located between the first silicon carbide region and the first plane, and a third silicon carbide portion of the first-conductivity type located between the second silicon carbide portion and the first plane;

etching the silicon carbide layer from the first plane to form a trench including a first side face, a second side face, and a bottom face between the first side face and the second side face, wherein a portion of the first side face being in contact with the first silicon carbide region includes a first region having a first inclination angle with respect to the first plane, a second region being closer to the second plane than the first region and having a second inclination angle smaller than the first inclination angle with respect to the first plane, and a third region being closer to the second plane than the second region and having a third inclination angle larger than the second inclination angle with respect to the first plane;

forming, in the silicon carbide layer, a fourth silicon carbide portion of the second-conductivity type being in contact with the second side face and the bottom face and having a second-conductivity type impurity concentration higher than a second-conductivity type impurity concentration in the second silicon carbide portion, by oblique ion implantation of the second-conductivity type impurity;

forming an insulating layer inside the trench;

forming a gate electrode on the insulating layer;

forming a first electrode on the first plane; and forming a second electrode on the second plane.

15. The method according to claim 14, wherein an acceleration voltage of the oblique ion implantation is less than 1 MeV.

16. The method according to claim 14, wherein the second inclination angle is 0 degrees or more and 30 degrees or less.

17. The method according to claim 14, wherein a width of the fourth silicon carbide portion between the second side face and the first silicon carbide region is 0.6 μm or less.

18. The method according to claim 14, wherein the second-conductivity type impurity concentration in the fourth silicon carbide portion is $1\times10^{18}$ cm$^{-3}$ or more and $1\times10^{21}$ cm$^{-3}$ or less.

* * * * *